United States Patent
Basu et al.

(10) Patent No.: US 10,694,641 B2
(45) Date of Patent: Jun. 23, 2020

(54) WICKLESS CAPILLARY DRIVEN CONSTRAINED VAPOR BUBBLE HEAT PIPES FOR APPLICATION IN ELECTRONIC DEVICES WITH VARIOUS SYSTEM PLATFORMS

(71) Applicant: Intel Corporation, Santa Clara, CA (US)

(72) Inventors: Sumita Basu, Portland, OR (US); Shantanu D. Kulkarni, Hillsboro, OR (US); Prosenjit Ghosh, Portland, OR (US); Konstantin I. Kouliachev, Olympia, WA (US)

(73) Assignee: Intel Corporation, Santa Clara, CA (US)

( * ) Notice: Subject to any disclaimer, the term of this patent is extended or adjusted under 35 U.S.C. 154(b) by 344 days.

(21) Appl. No.: 15/392,589

(22) Filed: Dec. 28, 2016

(65) Prior Publication Data

US 2017/0318702 A1     Nov. 2, 2017

Related U.S. Application Data

(60) Provisional application No. 62/329,359, filed on Apr. 29, 2016.

(51) Int. Cl.
*H05K 7/20*     (2006.01)
*F28D 15/02*     (2006.01)
(Continued)

(52) U.S. Cl.
CPC .......... *H05K 7/20336* (2013.01); *F28C 3/08* (2013.01); *F28D 15/025* (2013.01);
(Continued)

(58) Field of Classification Search
CPC .............. H05K 1/0272; F28D 15/0266; F28D 2015/0225; F28D 15/0233
See application file for complete search history.

(56) References Cited

U.S. PATENT DOCUMENTS

| 2,434,519 A | 1/1948 | Raskin |
| 3,251,410 A | 5/1966 | Raskin |

(Continued)

FOREIGN PATENT DOCUMENTS

| FR | 2998657 A1 * | 5/2014 | .......... H01M 10/625 |
| JP | 9191440 | 7/1997 | |

(Continued)

OTHER PUBLICATIONS

International Searching Authority, "Written Opinion", issued in connection with PCT patent application No. PCT/US2017/025120, dated Jun. 20, 2017, 8 pages.

(Continued)

*Primary Examiner* — Robert J Hoffberg
(74) *Attorney, Agent, or Firm* — Hanley, Flight and Zimmerman, LLC

(57) ABSTRACT

A system and method for providing and using wickless capillary driven constrained vapor bubble heat pipes for application in electronic devices with various system platforms are disclosed. An example embodiment includes: a substrate; and a plurality of wickless capillary driven constrained vapor bubble heat pipes embedded in the substrate, each wickless capillary driven constrained vapor bubble heat pipe including a body having a capillary therein with generally square corners and a high energy interior surface, and a highly wettable liquid partially filling the capillary to dissipate heat between an evaporator region and a condenser region.

20 Claims, 26 Drawing Sheets

US 10,694,641 B2

Page 2

(51) Int. Cl.
| | |
|---|---|
| *H05K 1/02* | (2006.01) |
| *H01L 23/427* | (2006.01) |
| *F28D 15/04* | (2006.01) |
| *G06F 1/20* | (2006.01) |
| *H01L 21/48* | (2006.01) |
| *H01L 23/538* | (2006.01) |
| *H05K 1/18* | (2006.01) |
| *H05K 3/00* | (2006.01) |
| *F28F 13/16* | (2006.01) |
| *F28C 3/08* | (2006.01) |
| *G06F 1/16* | (2006.01) |
| *H05K 5/00* | (2006.01) |
| *F28D 21/00* | (2006.01) |
| *F21V 8/00* | (2006.01) |
| *G02F 1/1333* | (2006.01) |

(52) U.S. Cl.
CPC ..... *F28D 15/0233* (2013.01); *F28D 15/0266* (2013.01); *F28D 15/0275* (2013.01); *F28D 15/0283* (2013.01); *F28D 15/046* (2013.01); *F28F 13/16* (2013.01); *G06F 1/1601* (2013.01); *G06F 1/20* (2013.01); *G06F 1/203* (2013.01); *H01L 21/4846* (2013.01); *H01L 21/4871* (2013.01); *H01L 23/427* (2013.01); *H01L 23/5389* (2013.01); *H05K 1/0203* (2013.01); *H05K 1/0272* (2013.01); *H05K 1/185* (2013.01); *H05K 3/0017* (2013.01); *H05K 3/0044* (2013.01); *H05K 5/0017* (2013.01); *H05K 7/20318* (2013.01); *H05K 7/20809* (2013.01); *F28D 2015/0225* (2013.01); *F28D 2021/0029* (2013.01); *F28F 2215/06* (2013.01); *G02B 6/0085* (2013.01); *G02F 1/133385* (2013.01); *H05K 2201/064* (2013.01)

(56) References Cited

U.S. PATENT DOCUMENTS

| | | | | |
|---|---|---|---|---|
| 4,116,266 A * | 9/1978 | Sawata | ........... | F28D 15/046 |
| | | | | 122/366 |
| 4,274,479 A * | 6/1981 | Eastman | ........... | F28D 15/046 |
| | | | | 122/366 |
| 4,763,727 A | 8/1988 | Kreuzer et al. | | |
| 4,883,116 A * | 11/1989 | Seidenberg | ........... | F28D 15/043 |
| | | | | 165/104.26 |
| 4,995,451 A | 2/1991 | Hamburgen | | |
| 5,179,043 A * | 1/1993 | Weichold | ........... | F28D 15/0233 |
| | | | | 165/104.26 |
| 5,309,457 A | 5/1994 | Minch | | |
| 5,309,986 A | 5/1994 | Itoh | | |
| 5,379,830 A | 1/1995 | Itoh | | |
| 5,527,588 A * | 6/1996 | Camarda | ........... | B32B 3/20 |
| | | | | 428/188 |
| 5,598,632 A * | 2/1997 | Camarda | ........... | B32B 3/20 |
| | | | | 29/890.032 |
| 5,660,229 A | 8/1997 | Lee et al. | | |
| 5,697,428 A | 12/1997 | Akachi | | |
| 5,769,154 A * | 6/1998 | Adkins | ........... | F28D 15/0233 |
| | | | | 126/96 |
| 5,937,936 A * | 8/1999 | Furukawa | ........... | F28D 15/0233 |
| | | | | 165/104.33 |
| 6,005,649 A | 12/1999 | Krusius et al. | | |
| 6,056,044 A * | 5/2000 | Benson | ........... | F28D 15/0233 |
| | | | | 165/104.26 |
| 6,062,302 A | 5/2000 | Davis et al. | | |
| 6,164,368 A * | 12/2000 | Furukawa | ........... | F28D 15/0233 |
| | | | | 165/104.33 |
| 6,293,333 B1* | 9/2001 | Ponnappan | ........ | F28D 15/0233 |
| | | | | 165/104.26 |
| 6,374,905 B1 | 4/2002 | Tantoush | | |
| 6,477,045 B1 | 11/2002 | Wang | | |
| 6,725,910 B2* | 4/2004 | Ishida | ........... | B21C 37/151 |
| | | | | 165/104.21 |
| 6,758,263 B2 | 7/2004 | Krassowski et al. | | |
| 6,917,522 B1 | 7/2005 | Erturk et al. | | |
| 7,080,683 B2 | 7/2006 | Bhatti et al. | | |
| 7,727,847 B2 | 6/2010 | Tanaka et al. | | |
| 7,848,624 B1* | 12/2010 | Zimbeck | ........... | F28D 15/046 |
| | | | | 392/342 |
| 7,978,472 B2 | 7/2011 | Campbell et al. | | |
| 8,235,096 B1* | 8/2012 | Mahefkey | ........... | F28D 15/046 |
| | | | | 165/104.26 |
| 8,351,207 B2 | 1/2013 | Jang et al. | | |
| 8,434,225 B2* | 5/2013 | Mahefkey | ........... | F28D 15/046 |
| | | | | 165/104.21 |
| 8,737,071 B2 | 5/2014 | Hao et al. | | |
| 9,921,003 B2* | 3/2018 | Monson | ........... | H05K 7/20672 |
| 10,219,409 B2 | 2/2019 | Basu et al. | | |
| 2004/0112572 A1 | 6/2004 | Moon et al. | | |
| 2004/0257768 A1 | 12/2004 | Ohmi et al. | | |
| 2005/0141197 A1 | 6/2005 | Erturk et al. | | |
| 2006/0157228 A1* | 7/2006 | Moon | ........... | F28D 15/0233 |
| | | | | 165/104.21 |
| 2006/0245214 A1 | 11/2006 | Kim | | |
| 2007/0019419 A1 | 1/2007 | Hafuka et al. | | |
| 2007/0107875 A1 | 5/2007 | Lee et al. | | |
| 2007/0130769 A1* | 6/2007 | Moon | ........... | B21C 23/085 |
| | | | | 29/890.032 |
| 2007/0240855 A1 | 10/2007 | Hou et al. | | |
| 2007/0240858 A1 | 10/2007 | Hou et al. | | |
| 2008/0062649 A1 | 3/2008 | Leng et al. | | |
| 2008/0142196 A1* | 6/2008 | Jeng | ........... | F28D 15/0233 |
| | | | | 165/104.26 |
| 2008/0185128 A1 | 8/2008 | Moon et al. | | |
| 2009/0009974 A1 | 1/2009 | Tseng et al. | | |
| 2009/0011547 A1 | 1/2009 | Lu et al. | | |
| 2009/0016023 A1 | 1/2009 | Cao et al. | | |
| 2009/0188110 A1* | 7/2009 | Moon | ........... | B21C 23/085 |
| | | | | 29/890.032 |
| 2009/0266514 A1* | 10/2009 | Agostini | ........... | H01L 23/427 |
| | | | | 165/80.3 |
| 2009/0323276 A1* | 12/2009 | Mongia | ........... | G06F 1/203 |
| | | | | 361/679.52 |
| 2010/0006846 A1 | 1/2010 | Nakamura et al. | | |
| 2011/0203777 A1* | 8/2011 | Zhao | ........... | F28D 15/046 |
| | | | | 165/104.26 |
| 2011/0209864 A1* | 9/2011 | Figus | ........... | F28D 15/0275 |
| | | | | 165/287 |
| 2012/0012604 A1 | 1/2012 | Pfister et al. | | |
| 2012/0120604 A1 | 5/2012 | Hao et al. | | |
| 2012/0145358 A1 | 6/2012 | Moon | | |
| 2013/0092354 A1 | 4/2013 | Semenov et al. | | |
| 2013/0186601 A1* | 7/2013 | Monson | ........... | H05K 7/20672 |
| | | | | 165/104.26 |
| 2013/0343002 A1 | 12/2013 | Kim et al. | | |
| 2014/0376189 A1 | 12/2014 | Sakaguchi | | |
| 2015/0253823 A1 | 9/2015 | Han | | |
| 2016/0088769 A1 | 3/2016 | Hsiao | | |
| 2016/0095197 A1* | 3/2016 | Lee | ........... | H05K 1/0272 |
| | | | | 361/700 |
| 2017/0314871 A1 | 11/2017 | Basu et al. | | |
| 2017/0314874 A1 | 11/2017 | Basu et al. | | |
| 2017/0318687 A1* | 11/2017 | Basu | ........... | H01L 21/4871 |

FOREIGN PATENT DOCUMENTS

| | | |
|---|---|---|
| JP | 2003110273 | 4/2003 |
| JP | 2010079403 | 4/2010 |
| JP | 2011155055 | 8/2011 |
| JP | 2012529759 | 11/2012 |

(56) References Cited

FOREIGN PATENT DOCUMENTS

| KR | 20050117482 | 12/2005 |
|----|-------------|---------|
| WO | 2016004531 | 1/2016 |

OTHER PUBLICATIONS

International Searching Authority, "Search Report", issued in connection with PCT patent application No. PCT/US2017/025120, dated Jun. 20, 2017, 3 pages.
International Searching Authority, "Search Report", issued in connection with PCT patent application No. PCT/US2017/025109, dated May 31, 2017, 5 pages.
International Searching Authority, "Written Opinion", issued in connection with PCT patent application No. PCT/US2017/025109, dated May 31, 2017, 6 pages.
International Searching Authority, "International Search Report", issued in connection with PCT patent application No. PCT/US2017/025100, dated Jun. 16, 2017, 5 pages.
International Searching Authority, "Written Opinion", issued in connection with PCT patent application No. PCT/US2017/025100, dated Jun. 16, 2017, 6 pages.
United States Patent and Trademark Office, "Notice of Allowance", issued in connection with U.S. Appl. No. 15/393,263, dated Nov. 8, 2017, 16 pages.
International Searching Authority, "Search Report", issued in connection with PCT patent application No. PCT/US2017/025096, dated May 31, 2017, 3 pages.
International Searching Authority, "Written Opinion", issued in connection with PCT patent application No. PCT/US2017/025096, dated May 31, 2017, 3 pages.
United States Patent and Trademark Office, "Non-Final Office action," issued in connection with U.S. Appl. No. 15/393,251, dated Sep. 26, 2018, 14 pages.
United States Patent and Trademark Office, "Notice of Allowance," mailed in connection with U.S. Appl. No. 15/393,263, dated Oct. 25, 2018, 15 pages.
United States Patent and Trademark Office, "Requirement for Restriction," mailed in connection with U.S. Appl. No. 15/393,258, dated Sep. 26, 2018, 5 pages.
United States Patent and Trademark Office, "Final Office action," issued in connection with U.S. Appl. No. 15/393,251, dated Jan. 15, 2019, 17 pages.
United States Patent and Trademark Office, "Restriction Requirement," issued in connection with U.S. Appl. No. 15/393,258, dated Dec. 26, 2018, 6 pages.
International Searching Authority, "International Preliminary Report on Patentability," issued in connection with PCT Patent Application No. PCT/US2017/025100, dated Oct. 30, 2018, 7 pages.
International Searching Authority, "International Preliminary Report on Patentability," issued in connection with PCT Patent Application No. PCT/US2017/025120, dated Oct. 30, 2018, 9 pages.
International Searching Authority, "International Preliminary Report on Patentability," issued in connection with PCT Patent Application No. PCT/US2017/025088, dated Oct. 30, 2018, 7 pages.
International Searching Authority, "International Preliminary Report on Patentability," issued in connection with PCT Patent Application No. PCT/US2017/025096, dated Oct. 30, 2018, 6 pages.
International Searching Authority, "International Preliminary Report on Patentability," issued in connection with PCT Patent Application No. PCT/US2017/025109, dated Oct. 30, 2018, 7 pages.
United States Patent and Trademark Office, "Restriction Requirement," issued in connection with U.S. Appl. No. 15/393,258, dated Mar. 29, 2019, 6 pages.
United States Patent and Trademark Office, "Advisory Action," issued in connection with U.S. Appl. No. 15/393,251, dated Mar. 22, 2019, 2 pages.
United States Patent and Trademark Office, "Non-Final Office action," issued in connection with U.S. Appl. No. 15/393,251, dated Apr. 4, 2019, 15 pages.
International Searching Authority, "International Search Report," issued in connection with PCT Patent Application No. PCT/US2017/025088, dated May 31, 2017, 3 pages.
International Searching Authority, "Written Opinion," issued in connection with PCT Patent Application No. PCT/US2017/025088, dated May 31, 2017, 6 pages.
United States Patent and Trademark Office, "Non-Final Office Action," issued in connection with U.S. Appl. No. 15/393,263, dated Apr. 3, 2018, 18 pages.
United States Patent and Trademark Office, "Notice to the applicant regarding a non-complaint amendment," issued in connection with U.S. Appl. No. 15/393,251, dated Oct. 21, 2019, 4 pages.
United States Patent and Trademark Office, "Requirement for Restrictions," issued in connection with U.S. Appl. No. 15/393,258, dated Dec. 12, 2019, 6 pages.
United States Patent and Trademark Office, Final Office action, issue in connection with U.S. Appl. No. 15/393,251, dated Feb. 12, 2020, 17 pages.

* cited by examiner

Operating temperature ranges of various working fluids
(Logarithmic temperature scale)

```
┌─────────────────────────────────────────────┐
│  Process Logic For Providing and Using a Wickless Capillary
│  Driven Constrained Vapor Bubble Heat Pipe for Application in
│  Electronic Devices with Various System Platforms
│                    -1100-
└─────────────────────────────────────────────┘
                      ▼
┌─────────────────────────────────────────────┐
│    Fabricate an electronic circuit into a substrate.
│                    -1110-
└─────────────────────────────────────────────┘
                      ▼
┌─────────────────────────────────────────────┐
│   Fabricate a plurality of embedded wickless capillary driven
│  constrained vapor bubble heat pipes into the substrate, each wickless
│  capillary driven constrained vapor bubble heat pipe including a body
│   having a capillary therein with generally square corners and a high
│   energy interior surface, and a highly wettable liquid partially filling
│    the capillary to dissipate heat between an evaporator region and a
│                        condenser region.
│                          -1120-
└─────────────────────────────────────────────┘
                      ▼
                   ( End )
```

FIG. 26

WICKLESS CAPILLARY DRIVEN CONSTRAINED VAPOR BUBBLE HEAT PIPES FOR APPLICATION IN ELECTRONIC DEVICES WITH VARIOUS SYSTEM PLATFORMS

PRIORITY PATENT APPLICATION

This is a non-provisional patent application claiming priority to U.S. provisional patent application, Ser. No. 62/329,359; filed Apr. 29, 2016. This non-provisional patent application draws priority from the referenced provisional patent application. The entire disclosure of the referenced patent application is considered part of the disclosure of the present application and is hereby incorporated by reference herein in its entirety.

TECHNICAL FIELD

This patent application relates to electronic systems and devices, mobile devices, and the fabrication and thermal dissipation of such devices and systems, according to various example embodiments, and more specifically to a system and method for providing and using wickless capillary driven constrained vapor bubble heat pipes for application in electronic devices with various system platforms.

BACKGROUND

Modern electric or electronic devices include many components that generate heat, including, but not limited to processors/controllers, signal processing devices, memory devices, communication/transceiver devices, power generation devices, and the like. Adequate thermal management of these components is critical to the successful operation of these systems and devices. When components generate a large amount of heat, the heat must be dissipated or transported quickly away from the heat source in order to prevent failure of the heat producing components.

In the past, thermal management of electronic components has included air-cooling systems and liquid-cooling systems. Regardless of the type of fluid used (e.g., air or liquid), it may be challenging to deliver the fluid to the heat source, e.g., the component generating large amounts of heat. For example, electronic devices, such as mobile devices or wearables, may include processors and/or integrated circuits within enclosures that make it difficult for a cooling fluid to reach the heat generating components.

To transfer the heat away from these difficult to access components, conventional solutions use plates made from highly thermally-conductive material, such as graphite or metal, that have been placed in thermal contact with the heat generating components such that the heat is carried away via conduction through the plate. However, the speed and efficiency of the heat transport in a solid plate is limited by the thermal resistance of the material.

Conventional solutions also use wicked heat pipes to transfer heat from a heated region (also referred to as an evaporator region) to a cooled region (also referred to as a condenser region). A traditional wicked heat pipe consists of a tube with a wick running along the interior surface of the tube. The tube is filled with a liquid that evaporates into a vapor at the evaporator region, which then flows toward the condenser region. The vapor condenses back into a liquid at the condenser region. The wick enables the condensed liquid to flow back to the evaporator region for the cycle to repeat.

However, there are many challenges with wicked or grooved structures in integrated vapor chambers or liquid cooled heat pipes on standard Printed Circuit Boards (PCBs), for example. A few of these disadvantages with conventional wicked or grooved structures are summarized below:

Micro-grooved structures showed poor performance in gravity operations;
 Lack of fluid crossover ability causes circulation challenges;
 The wicks cause a thermal resistance inside the pipe itself;
 Insertion of a wick structure (regardless of porosity and design) is a challenge and not a common practice for PCB manufacturers;
 Insertable wick requires an additional copper restraint to hold it in place to allow for a cavity for vapor;
 The inside of vapor chambers and heat pipes is usually coated in sintered metal, which creates problems. The basic problem is that the inside of both the vapor chamber and the heat pipe have very little surface area.

BRIEF DESCRIPTION OF THE DRAWINGS

The various embodiments are illustrated by way of example, and not by way of limitation, in the figures of the accompanying drawings in which:

FIG. 25 also illustrates an example embodiment showing cross patterning to allow for effectiveness in all orientations of a device;

FIG. 26 is a process flow chart illustrating an example embodiment of a method as described herein.

DETAILED DESCRIPTION

In the following description, for purposes of explanation, numerous specific details are set forth in order to provide a thorough understanding of the various embodiments. It will be evident, however, to one of ordinary skill in the art that the various embodiments may be practiced without these specific details.

Figure 1:
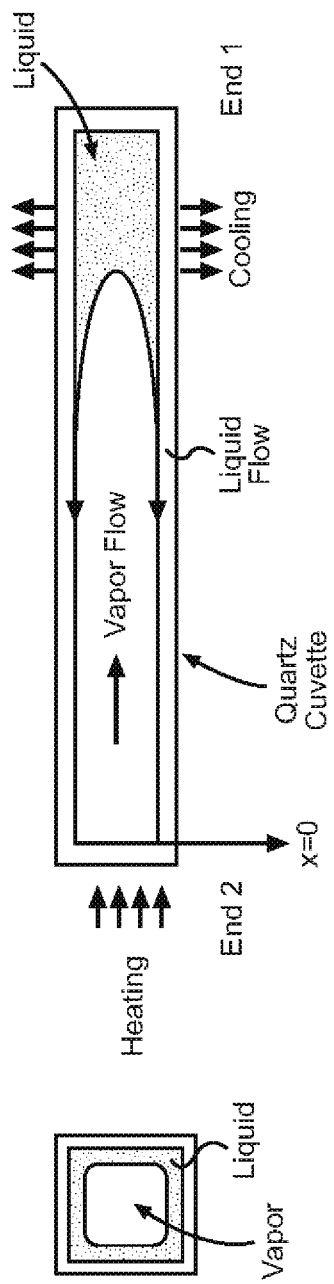
FIG. 1 illustrates an example embodiment of the wickless capillary driven constrained vapor bubble (CVB) heat pipe as disclosed herein.

In the various embodiments described herein, a system and method for providing and using a wickless capillary driven constrained vapor bubble (CVB) heat pipe are disclosed. FIG. 1 illustrates an example embodiment of the wickless capillary driven CVB heat pipe as disclosed herein. The various example embodiments disclosed herein provide a variety of advantages over conventional solutions. For example, the wickless CVB heat pipe of the various example embodiments disclosed herein:

Leads to simpler and lighter systems;
Can be used for space and electronic cooling applications;
Is effective as the dimension of the cavity can be reduced and the heat pipe can become a micro heat pipe;
Is easier to manufacture by PCB manufacturers or other device fabricators, as there are no wick structures to insert or adhere to the walls of the heat pipe;
Does not require moving parts; and
Capillary forces in the corners of the channels drive the liquid to the evaporator.

As a result, there are no challenges because of wicks or grooved structures as described above. Circular or rounded corner channels do not provide this advantage.

Figure 2:
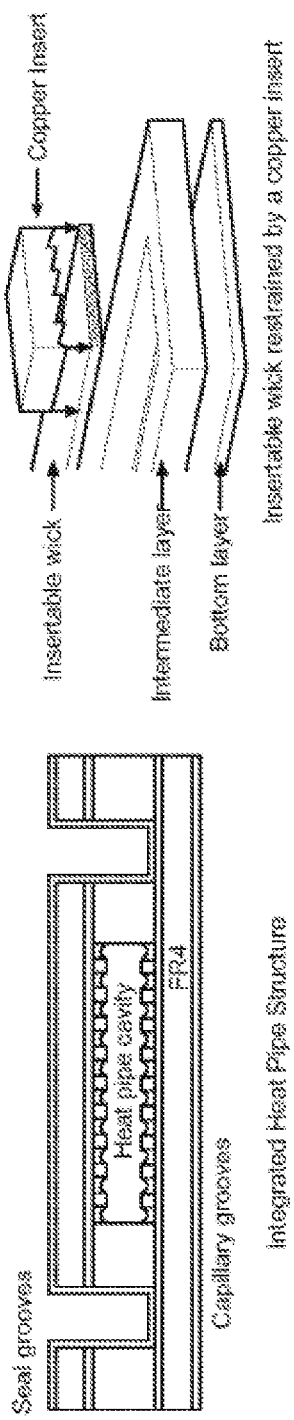
FIGS. 2 and 3 illustrate some of the disadvantages of the conventional wicked or grooved heat pipe structures.
Figure 3:
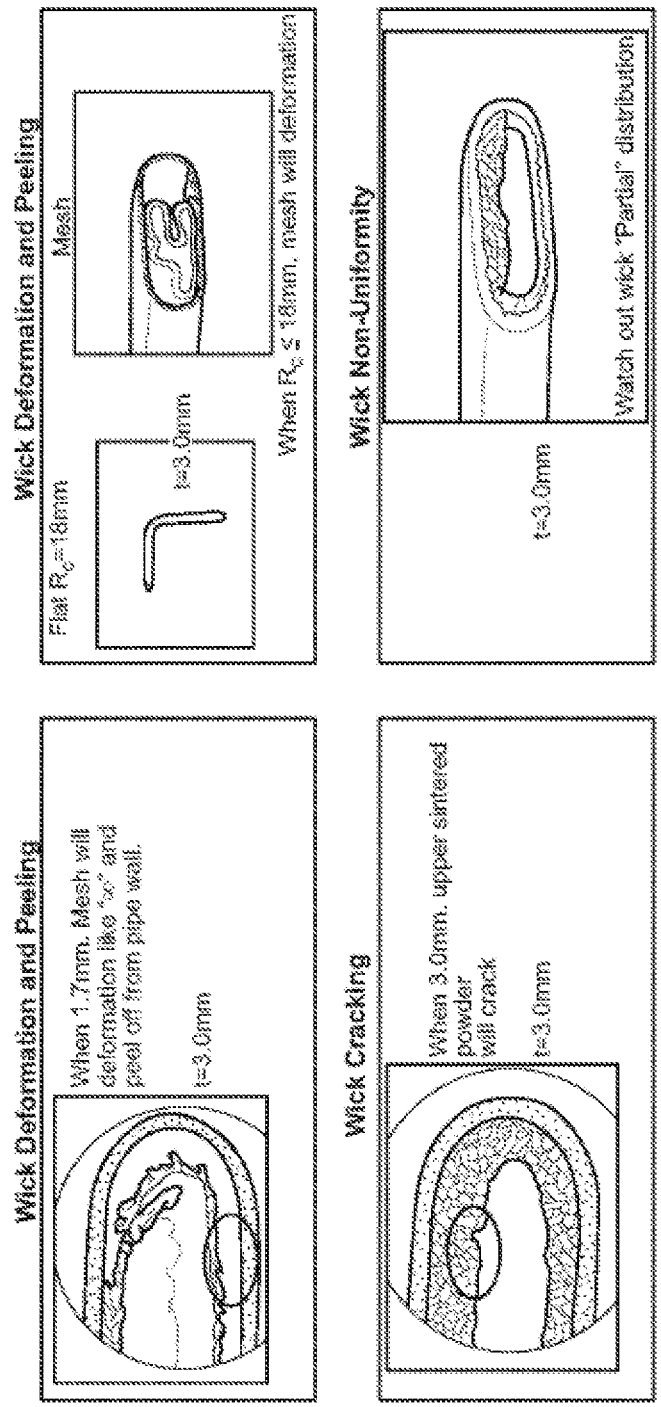

FIGS. 2 and 3 illustrate some of the disadvantages of the conventional wicked or grooved heat pipe structures. A few of these disadvantages with conventional wicked or grooved structures are summarized below:

Micro-grooved structures showed poor performance in gravity operations;
Lack of fluid crossover ability causes circulation challenges;
The wicks cause a thermal resistance inside the pipe itself;
Insertion of a wick structure (regardless of porosity and design) is a challenge and not a common practice for PCB manufacturers;
Insertable wicks require an additional copper restraint to hold it in place to allow a cavity for vapor;
The insides of the vapor chambers and the heat pipes are usually coated in sintered metal, which creates problems. The basic problem is that the inside of both the vapor chamber and the heat pipe have very little surface area; and
Wicked heat pipes have a tendency to experience "dry-out," whereby the liquid in the evaporator region is fully vaporized and the wick becomes void of liquid.

Figure 4A:
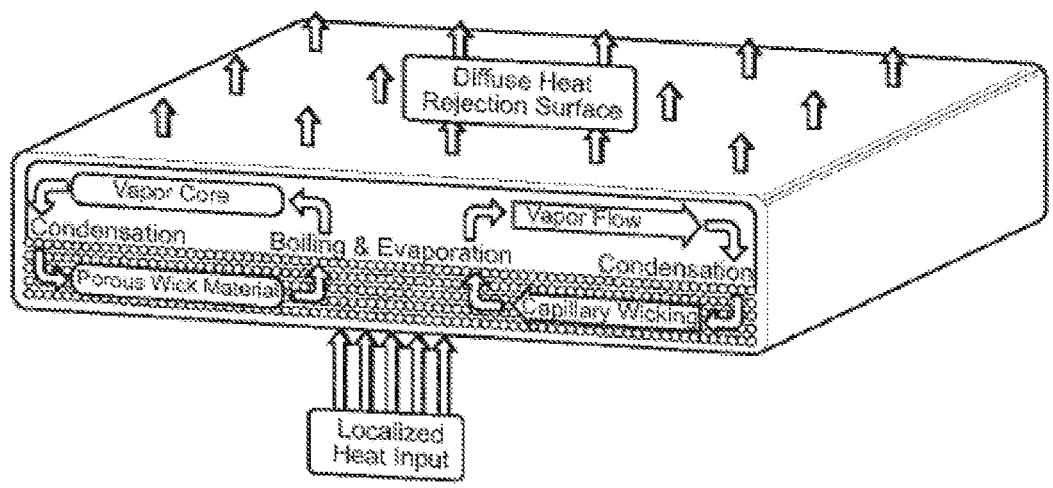
FIG. 4A illustrates an example of nucleate boiling in porous wick structures.

FIG. 4A illustrates an example of nucleate boiling in porous wick structures. Conventional wisdom calls for nucleate boiling to be avoided in wicked heat pipes having longitudinal groove wick structures. In these wicks, nucleation of vapor bubbles completely obstructs the non-communicating individual paths of capillary liquid return to the evaporator section; a boiling limit is imposed in this case based on the conventional nucleation incipience superheat criterion. Alternatively, sintered screen mesh, sintered powder, and fibrous wick structures affixed to the wall of a heat pipe can continue to feed liquid to the heat source during boiling via the inherently stochastic network of interconnected pores. The various embodiments disclosed herein avoid these problems inherent in wicked heat pipes.

The table below provides a comparison between wicked and wickless heat pipes.

|  | Wick-type heat pipes | Wickless (CVB) heat pipes |
| --- | --- | --- |
| Manufacturing | The fabrication consists of added steps and complexity due to the varied nature of the wicks and inserts needed to keep them in place (adhered to the wall of the pipe). | These are much simpler to fabricate as there are no wick structures to insert or adhere to the walls of the heat pipe. |
| Performance | The performance can be better than the wickless type as it can avoid dry out for longer heat loads with aided capillary flow to the heated end. The combination of the wick structure and material would determine performance. | Performance could be hindered on high heat loads if capillary pumping head drops off (too long of a bubble). The size of the Constrained Vapor Bubble would drive the performance and when compared to a similar sized wick type pipe, the ease of manufacturability and longevity of this type of heat pipe wins. |
| Simplicity | Wick structure and material of the wick can be complex and tough to maintain. Wicks add to cost of the device. | Lack of a material wick makes this simpler and lighter to use. Also, less expensive to build. |
| Challenges | Longevity of wicks is a challenge, cost incurred due to addition of a wick is another challenge. PCB manufacturers do not have a standard process for inserting the wicks. Nucleate boiling within wick structure creates problems. | Long dry-out lengths at high heat loads for large bubble sizes creates challenges. Maintaining symmetry of capillary flow in a horizontal direction on Earth could be an issue. |

Figure 4B:
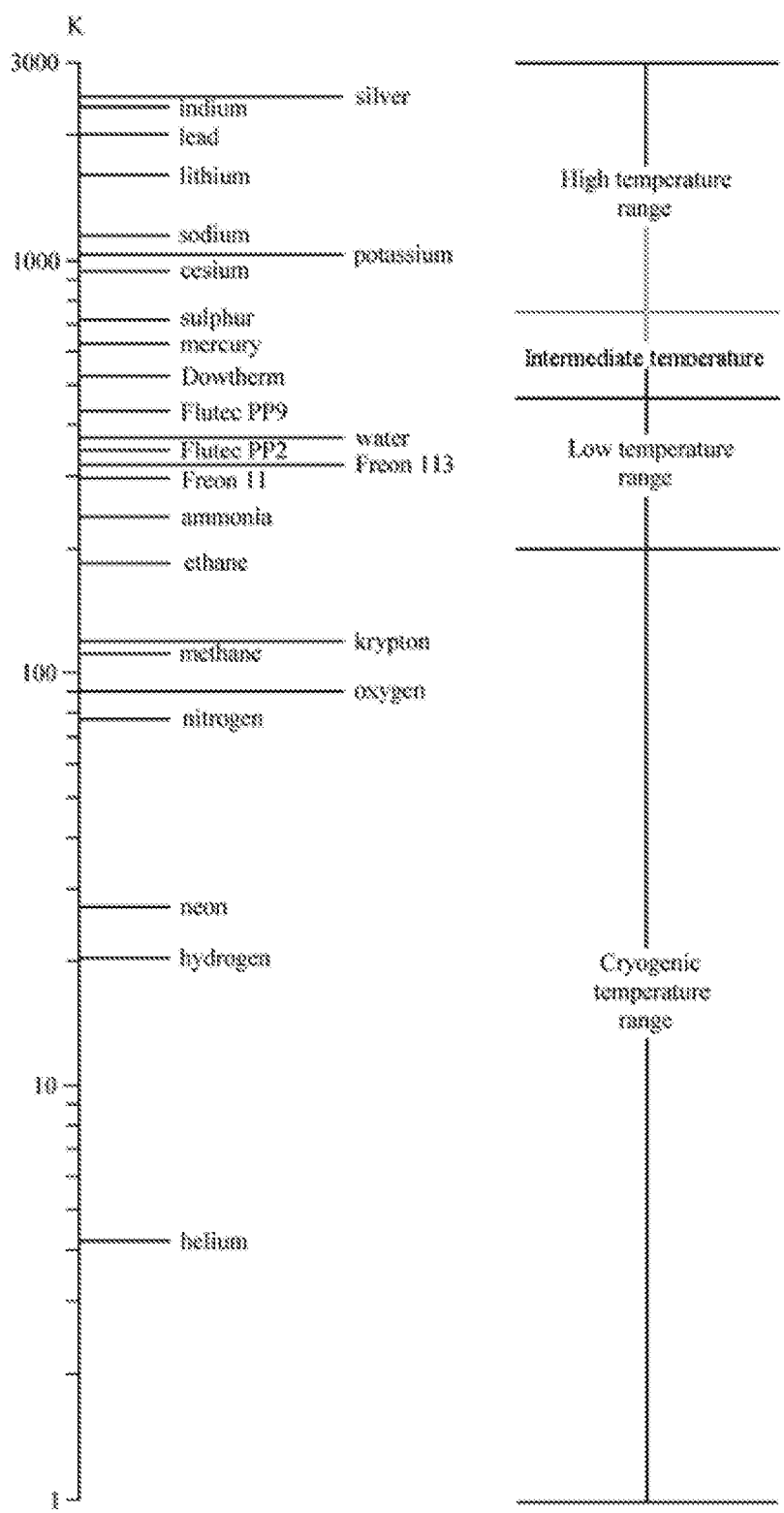
FIG. 4B illustrates a logarithmic temperature scale of operating temperature ranges of different working fluids.

The tables below and the logarithmic scal shown in FIG. 4B provide a summary of fluid possibilities and material compatibility for various operating temperature ranges for the CVB wickless heat pipes of example embodiments.

TABLE 1

Working fluids and temperature ranges of heat pipes.

| Working Fluid | Melting Point, K at 1 atm | Boiling Point, K at 1 atm | Useful Range, K |
|---|---|---|---|
| Helium | 1.0 | 4.21 | 2-4 |
| Hydrogen | 13.8 | 20.38 | 14-31 |
| Neon | 24.4 | 27.09 | 27-37 |
| Nitrogen | 63.1 | 77.35 | 70-103 |
| Argon | 83.9 | 87.29 | 84-116 |
| Oxygen | 54.7 | 90.18 | 73-119 |
| Methane | 90.6 | 111.4 | 91-150 |
| Krypton | 115.8 | 119.7 | 116-160 |
| Ethane | 89.9 | 184.6 | 150-240 |
| Freon 22 | 113.1 | 232.2 | 193-297 |
| Ammonia | 195.5 | 239.9 | 213-373 |
| Freon 21 | 138.1 | 282.0 | 233-360 |
| Freon 11 | 162.1 | 296.8 | 233-393 |
| Pentane | 143.1 | 309.2 | 253-393 |
| Freon 113 | 236.5 | 320.8 | 263-373 |
| Acetone | 180.0 | 329.4 | 273-393 |
| Methanol | 175.1 | 337.8 | 283-403 |
| Flutec PP2 | 223.1 | 349.1 | 283-433 |
| Ethanol | 158.7 | 351.5 | 273-403 |
| Heptane | 182.5 | 371.5 | 273-423 |
| Water | 273.1 | 373.1 | 303-550 |
| Toluene | 178.1 | 383.7 | 323-473 |
| Flutec PP9 | 203.1 | 433.1 | 273-498 |
| Naphthalene | 353.4 | 490 | 408-623 |
| Dowtherm | 285.1 | 527.0 | 423-668 |
| Mercury | 234.2 | 630.1 | 523-923 |
| Sulphur | 385.9 | 717.8 | 530-947 |
| Cesium | 301.6 | 943.0 | 723-1173 |
| Rubidium | 312.7 | 959.2 | 800-1275 |
| Potassium | 336.4 | 1032 | 773-1273 |
| Sodium | 371.0 | 1151 | 873-1473 |
| Lithium | 453.7 | 1615 | 1273-2073 |
| Calcium | 1112 | 1762 | 1400-2100 |
| Lead | 600.6 | 2013 | 1670-2200 |
| Indium | 429.7 | 2353 | 2000-3000 |
| Silver | 1234 | 2485 | 2073-2573 |

TABLE 2

Generalized results of experimental compatibility tests

| Working fluid | Compatible Material | Incompatible Material |
|---|---|---|
| Water | Stainless Steel[a], Copper, Silica, Nickel, Titanium | Aluminum, Inconel |
| Ammonia | Aluminum, Stainless Steel, Cold Rolled Steel, Iron, Nickel | |
| Methanol | Stainless Steel, Iron Copper, Brass, Silica, Nickel | Aluminum |
| Acetone | Aluminum, Stainless Steel, Copper, Brass, Silica | |
| Freon-11 | Aluminum | |
| Freon-21 | Aluminum, Iron | |
| Freon-113 | Aluminum | |
| Heptane | Aluminum | |
| Dowtherm | Stainless Steel, Copper, Silica | |
| Lithium | Tungsten, Tantalum, Molybdenum, Niobium | Stainless Steel, Nickel, Inconel, Titanium |//

TABLE 2-continued

Generalized results of experimental compatibility tests

| Working fluid | Compatible Material | Incompatible Material |
|---|---|---|
| Sodium | Stainless Steel, Nickel, Inconel, Niobium | Titanium |
| Cesium | Titanium, Niobium, Stainless Steel, Nickel-based superalloys | |
| Mercury | Stainless Steel[b] | Molybdenum, Nickel, Tantalum, Inconel, Titanium, Niobium |
| Lead | Tungsten, Tantalum | Stainless Steel, Nickel, Inconel, Titanium, Niobium |
| Silver | Tungsten, Tantalum | Rhenium |

[a]Sensitive to cleaning;
[b]with Austenitic SS

Figure 5:
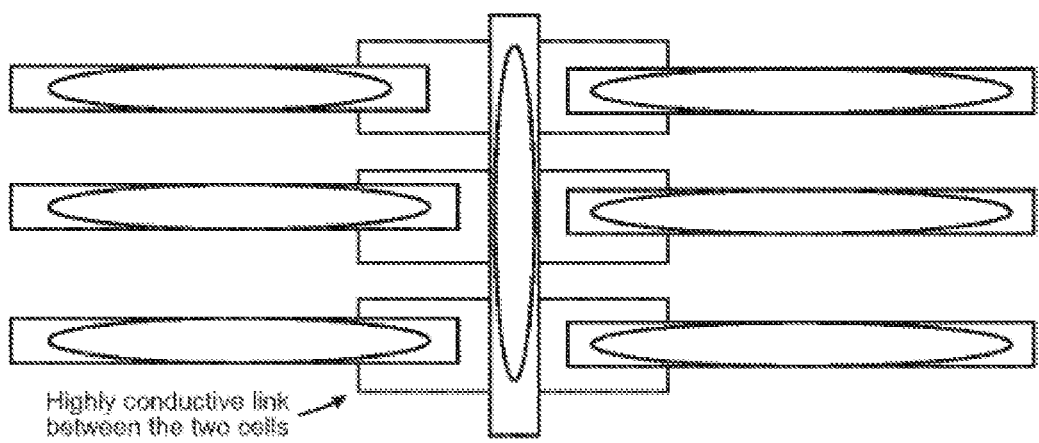
FIG. 5 illustrates some of the techniques with which the embodiments described herein overcome some of the challenges.

FIG. 5 illustrates some of the techniques with which the embodiments described herein overcome some of the challenges. In some circumstances, the wickless CVB heat pipe can also encounter some implementation issues. In particular, a lack of wettability of liquid to the surface, a high heat load, and opposing gravity can cause longer dry out lengths where the liquid loses contact with the wall and degrades the CVB's performance However, the embodiments described herein overcome these challenges in a variety of ways including by use of one or more of the techniques listed below and shown in FIG. 5:

Array (daisy chaining) of shorter CVB cells can be used to increase the total CVB length. In this embodiment, the condenser for one cell acts as the evaporator of an adjacent cell;

Cross patterns of CVB arrays can make them work in any gravity orientation;

Using a highly wettable liquid with a high energy surface can decrease dry outs; and Micro-sized piezo devices can be used to help increase capillary lengths.

Figure 6:
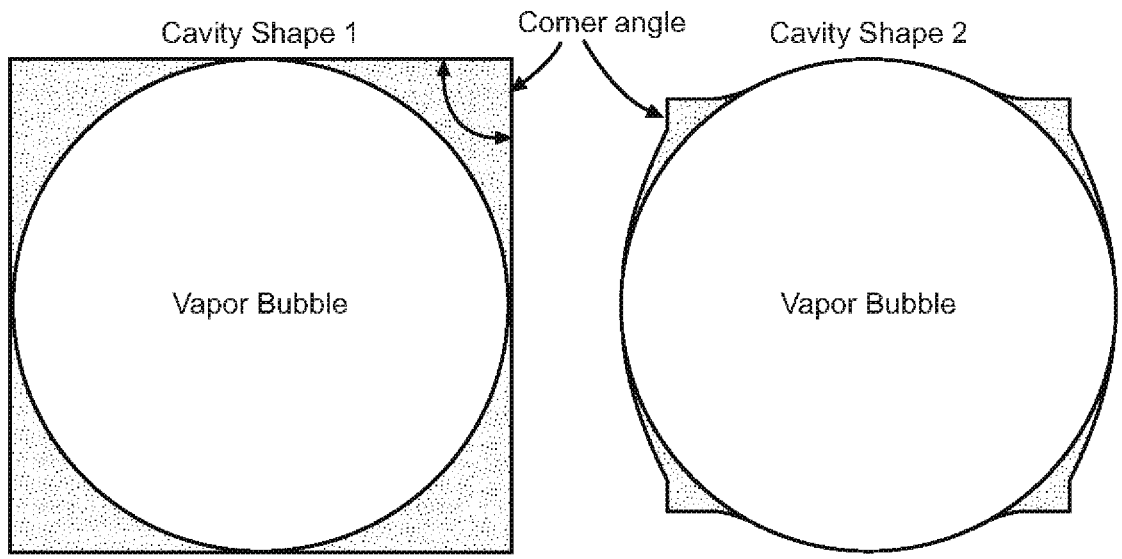
FIG. 6 illustrates example embodiments showing novel cavity shapes.

The wickless CVB heat pipe of various example embodiments is designed with regard to several important parameters as listed below:

Gravity impact
Fin effectiveness
Dry out lengths
Dimensions and shapes
Heat transfer rates
Liquid vapor interface
Surface tension
Wettability FIG. 6 illustrates example embodiments showing novel cavity shapes. Liquid rising in the capillary formed by the vapor bubble and cavity walls can be manipulated by use of various cavity shapes. Through innovative cavity shapes as shown in FIG. 6, CVB capillary lengths can be tuned for the same vapor bubble diameter. Geometries that create smaller corner angles with effectively smaller hydraulic radii can lead to larger capillary lengths. Tools can help to predict approximate capillary lengths for different corner areas, bubble diameters, contact angles, and different fluid properties. This can help to tune the cavity dimensions per the available surface dimensions and fluids in products.

Figure 7:
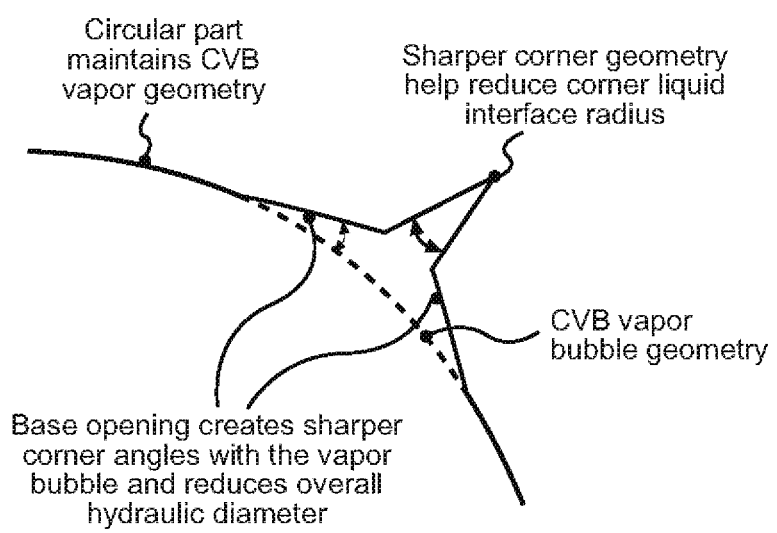
FIG. 7 illustrates an example embodiment showing the idea behind the new cavity shapes.

FIG. 7 illustrates an example embodiment showing the idea behind the new cavity shapes. The circular part of the shape maintains CVB vapor geometry. Sharper corner geometry help reduce the corner liquid interface radius. The base opening creates sharper corner angles with the vapor bubble and reduces overall hydraulic diameter.

Figure 8:
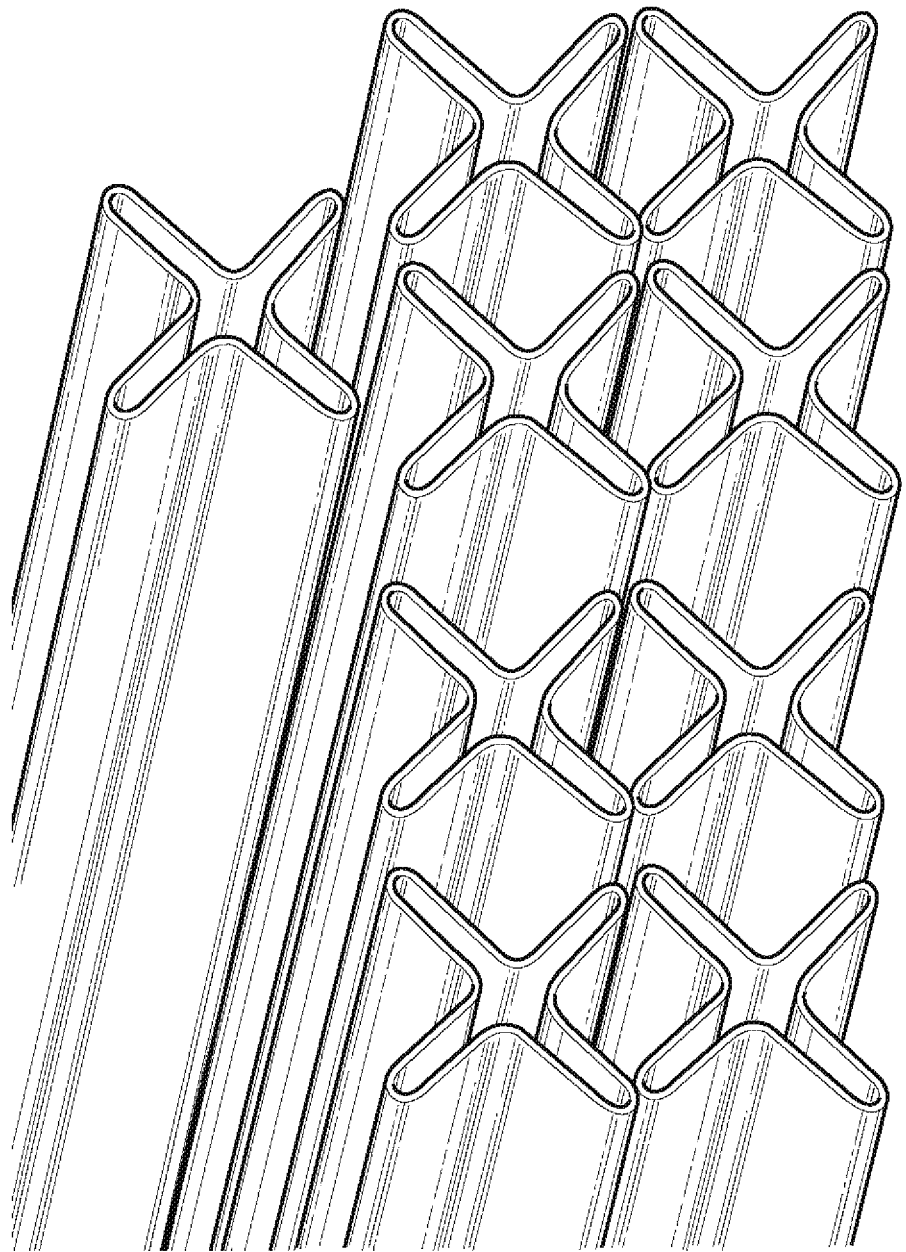
FIG. 8 illustrates an example embodiment showing the manufacturability of the new cavity shapes.

FIG. 8 illustrates an example embodiment showing the manufacturability of the new cavity shapes. In various example embodiments, non-standard/novel shapes can include flowers, octagons, stars, triangles, and the like. Most metal manufacturers can make it (as long as it's under 2" in diameter), which is ideal for micro heat pipes. Like standard shapes, the tubing is formed and welded into the "mother" round shape before it can be finalized. In the case of the x-shaped tubing as shown in FIG. 8, the tubing went from round to square, and then was formed into the "x" shape. Uncommon shapes may go through many different shaping processes to meet the client's requirements. Different techniques used include welding, laser cutting, injection molding, etc. For non-metallic tube material, one can use chemical etch or heat shaping.

Figure 9:
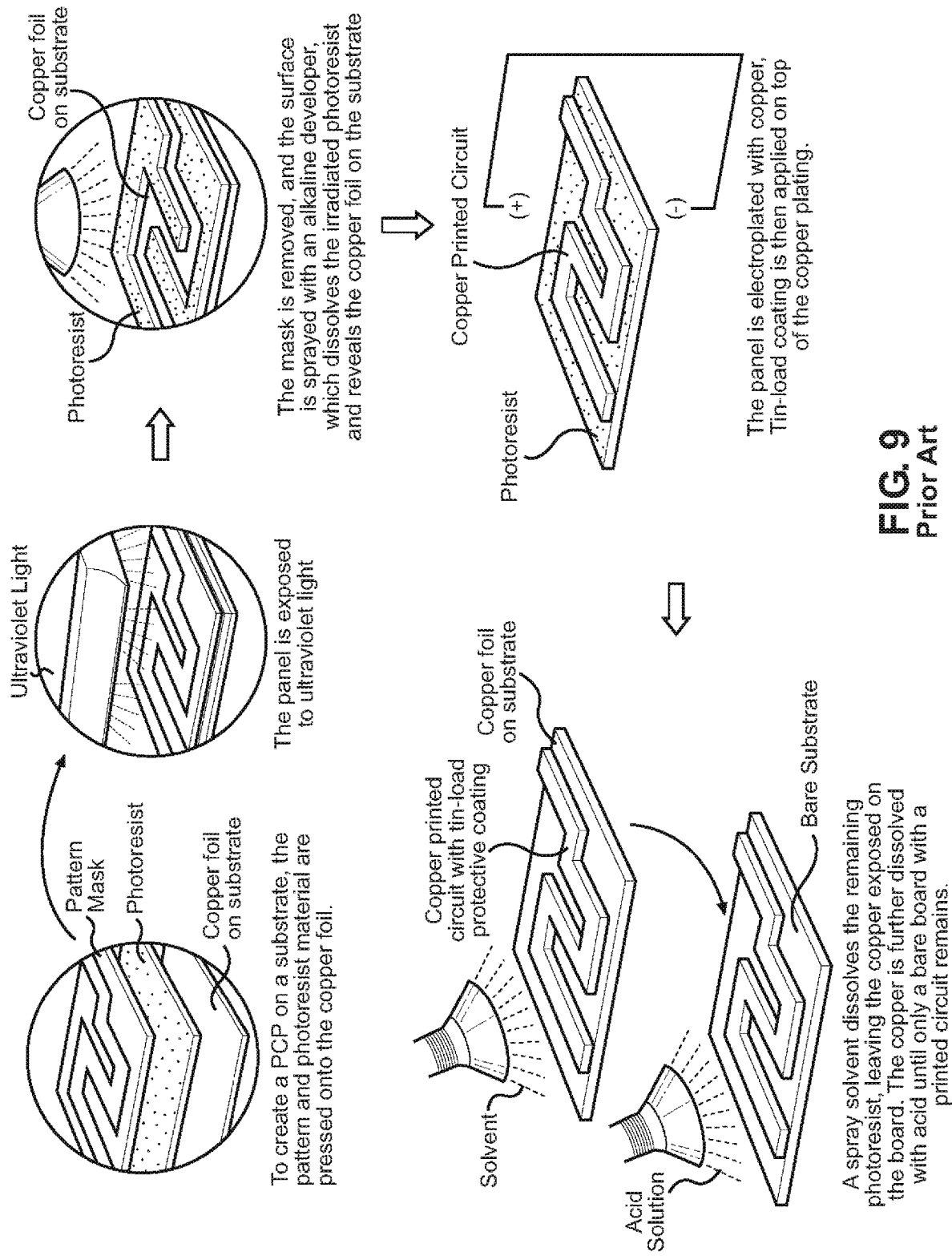
FIG. 9 illustrates a typical Printed Circuit Board (PCB) fabrication process.
Figure 10:
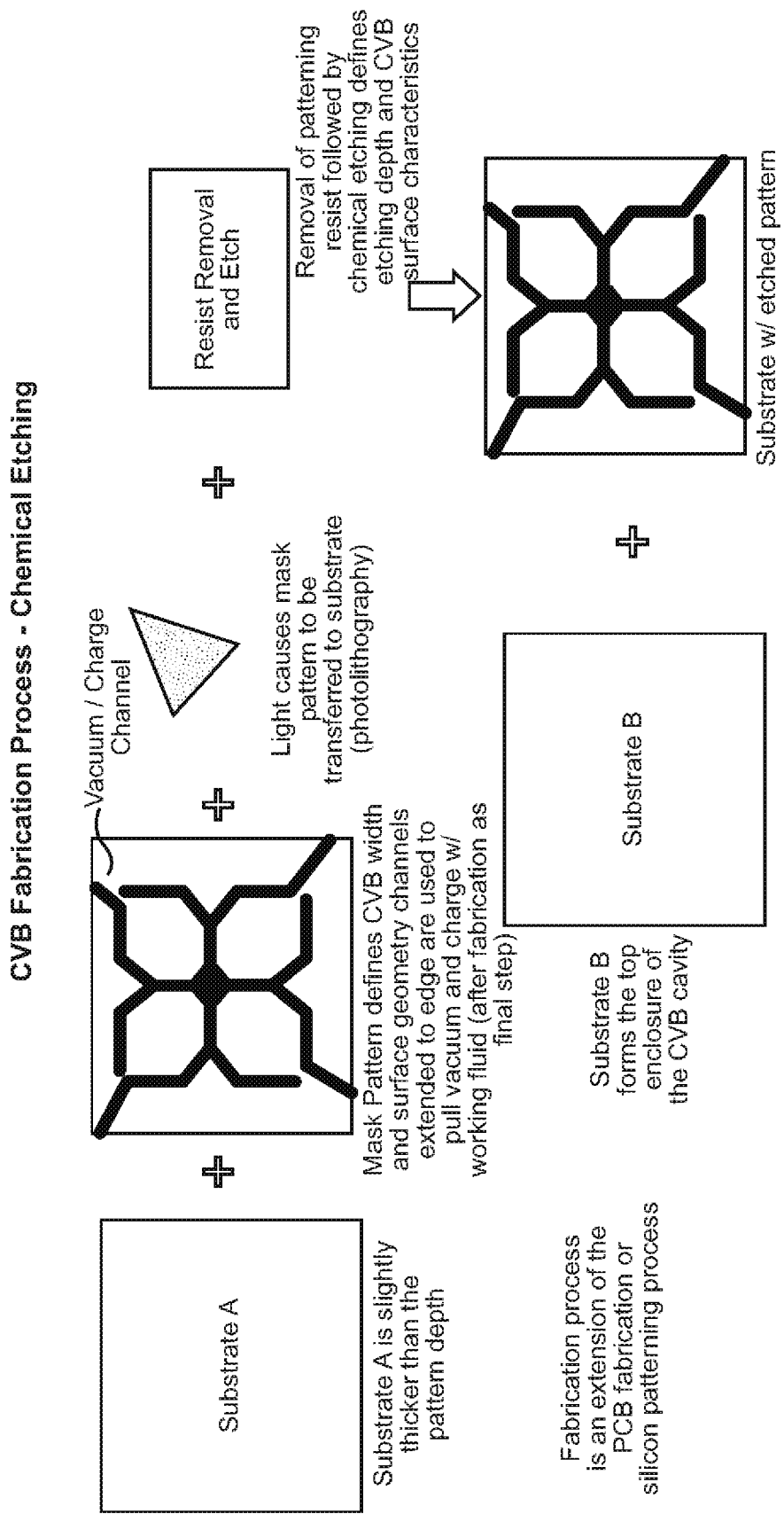
FIG. 10 illustrates an example embodiment of a CVB heat pipe fabrication process using chemical etching.
Figure 11:
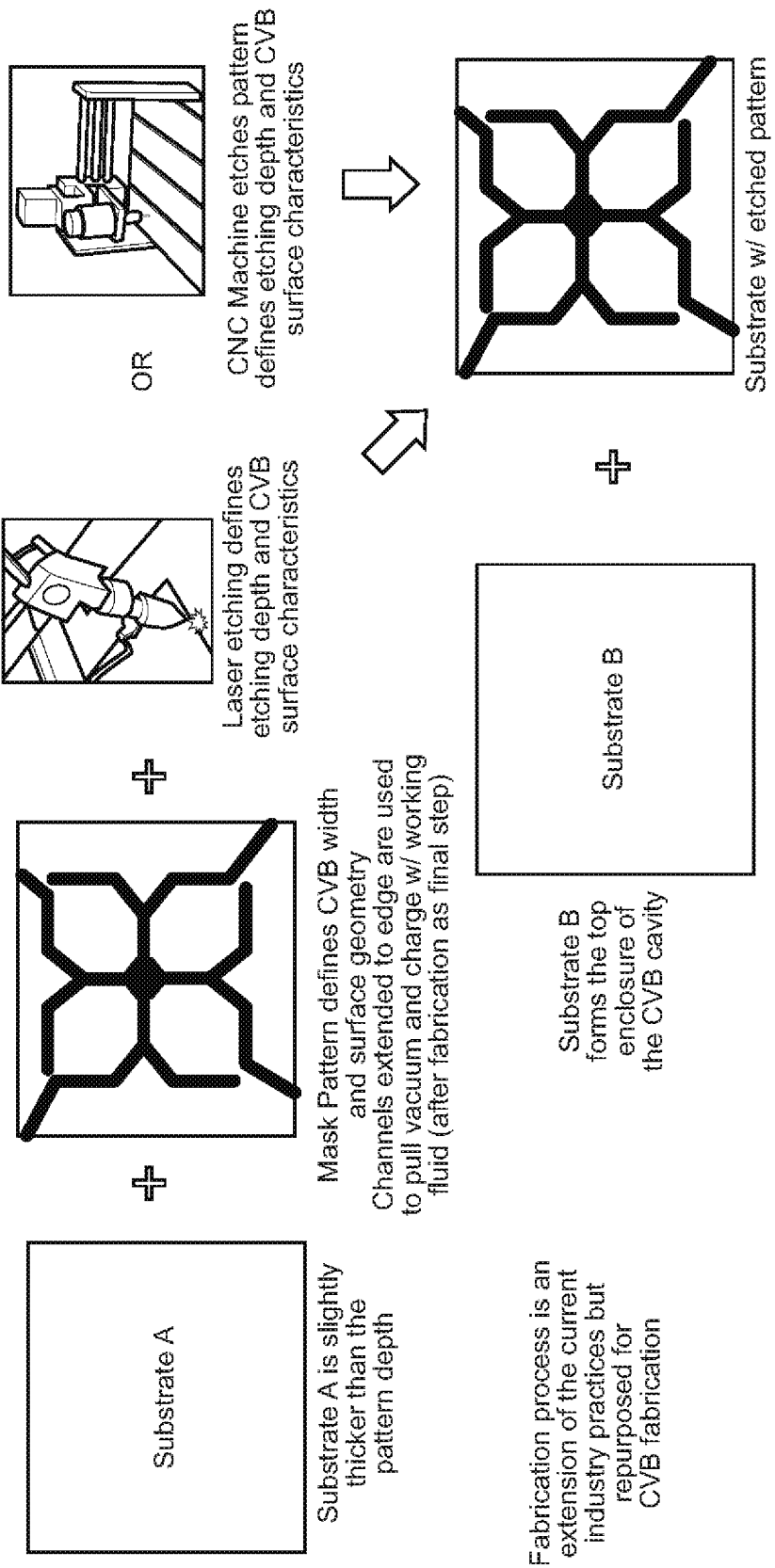
FIG. 11 illustrates an example embodiment of a CVB heat pipe fabrication process using laser/mechanical subtraction.
Figure 12:
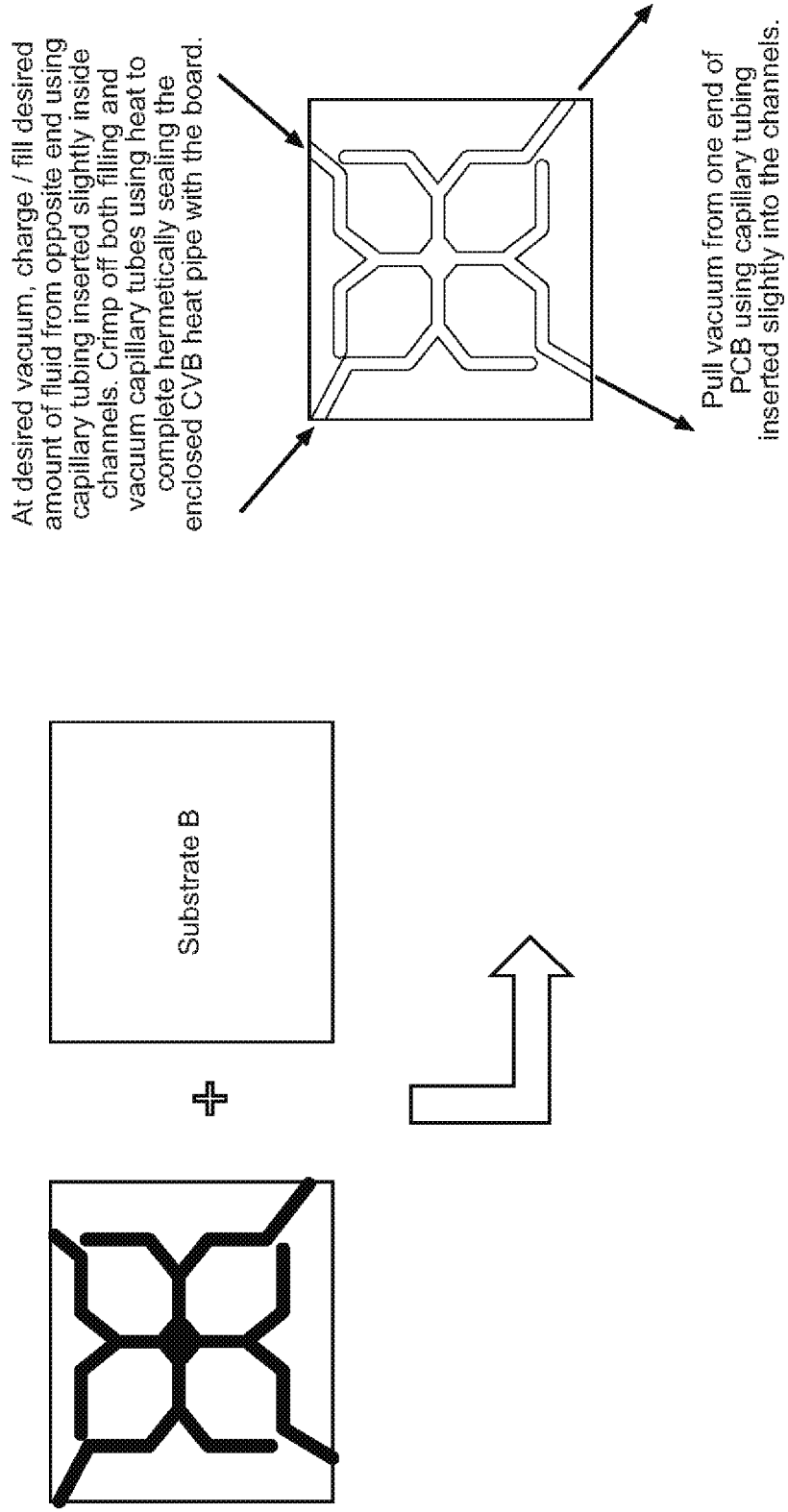
FIG. 12 illustrates an example embodiment of a CVB charging process using vacuum, fill, and seal.

FIG. 9 illustrates a typical Printed Circuit Board (PCB) fabrication process. Such processes can be modified and applied to the fabrication of CVB heat pipes. FIG. 10 illustrates an example embodiment of a CVB heat pipe fabrication process using chemical etching. In general, the CVB heat pipe fabrication process of an example embodiment is an extension of the PCB fabrication or silicon patterning process. FIG. 11 illustrates an example embodiment of a CVB heat pipe fabrication process using laser/mechanical subtraction. FIG. 12 illustrates an example embodiment of a CVB charging process using vacuum, fill, and seal.

Figure 13:
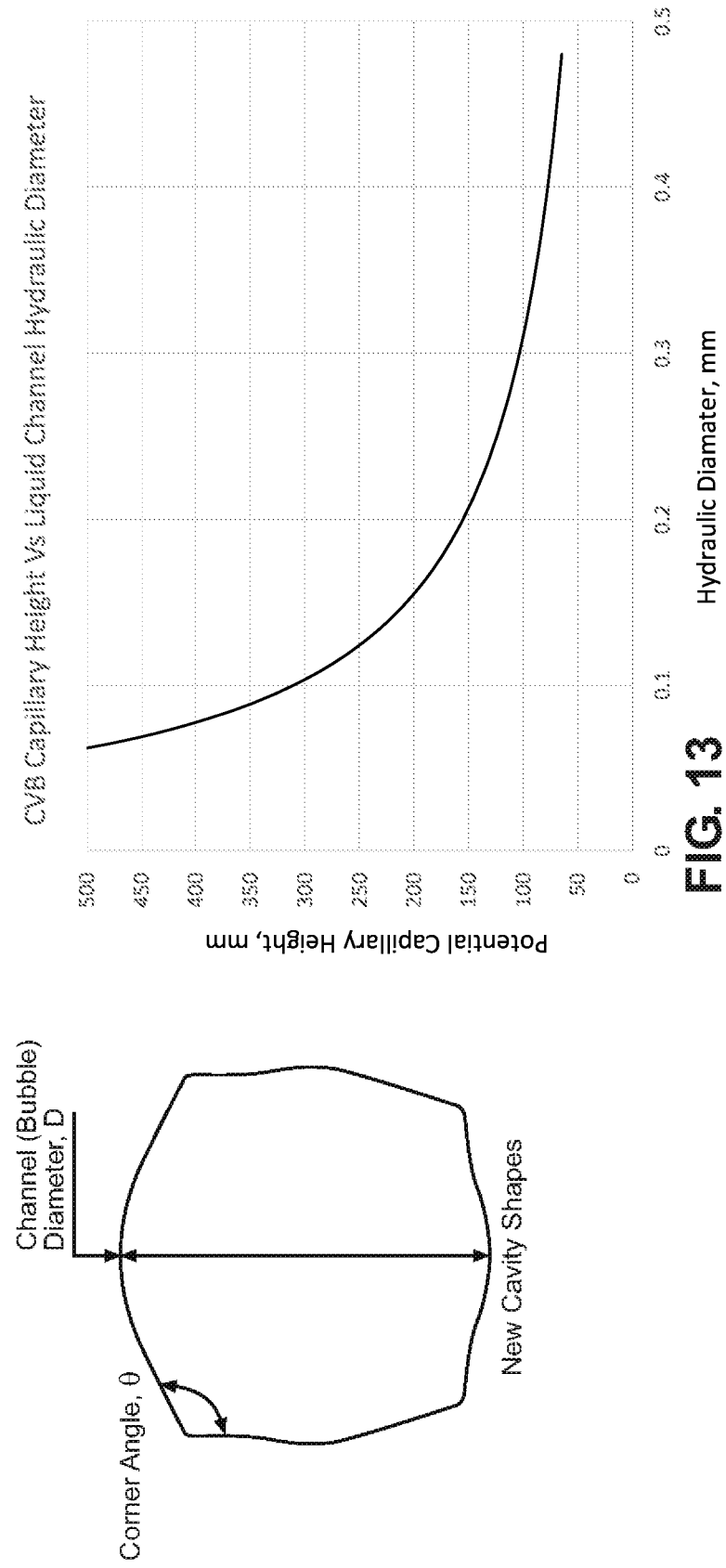
FIG. 13 illustrates an example embodiment showing capillary heights for CVB for different cavity shapes.

FIG. 13 illustrates an example embodiment showing capillary lengths for CVB heat pipes for different cavity shapes. The corner angles of the cavity can be modified and adjusted to determine a corresponding capillary length. A tool can help to predict an approximate capillary length for different corner angles, channel diameters, contact angles, and different fluid properties. This can help to tune the cavity dimensions per the available surface dimensions and fluids in products.

Figure 14:
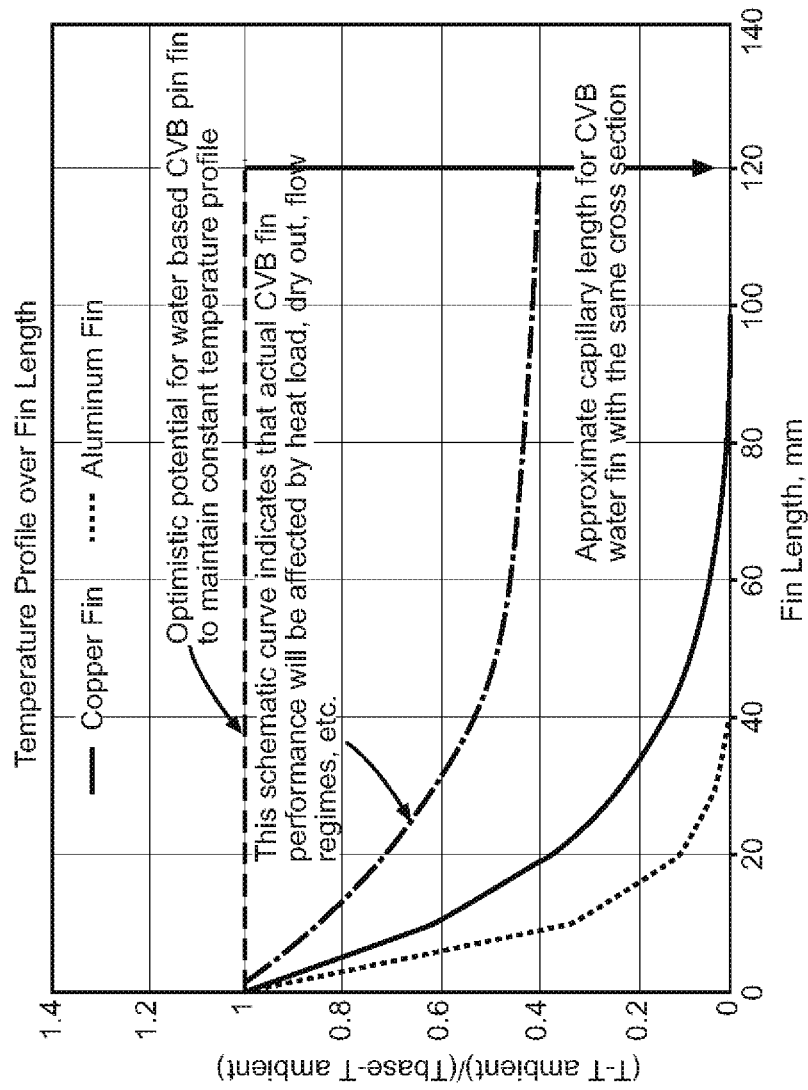
FIG. 14 illustrates a temperature comparison between a CVB fin and a metal fin.

FIG. 14 illustrates a temperature comparison between a CVB fin and a metal fin. The basic calculations show a potential for a high temperature profile for a longer length CVB fin. Higher temperatures over the fin result in higher heat transfer. This indicates the potential for taller, thinner, and efficient fins with the CVB embodiments described herein. The CVB embodiments described herein avoid dry outs and maximize two phase heat transfer for a given fin length. Heat sink based on CVB fins can be expected to be lighter as compared to non-CVB based heat sinks for similar thermal performance.

Figure 15:
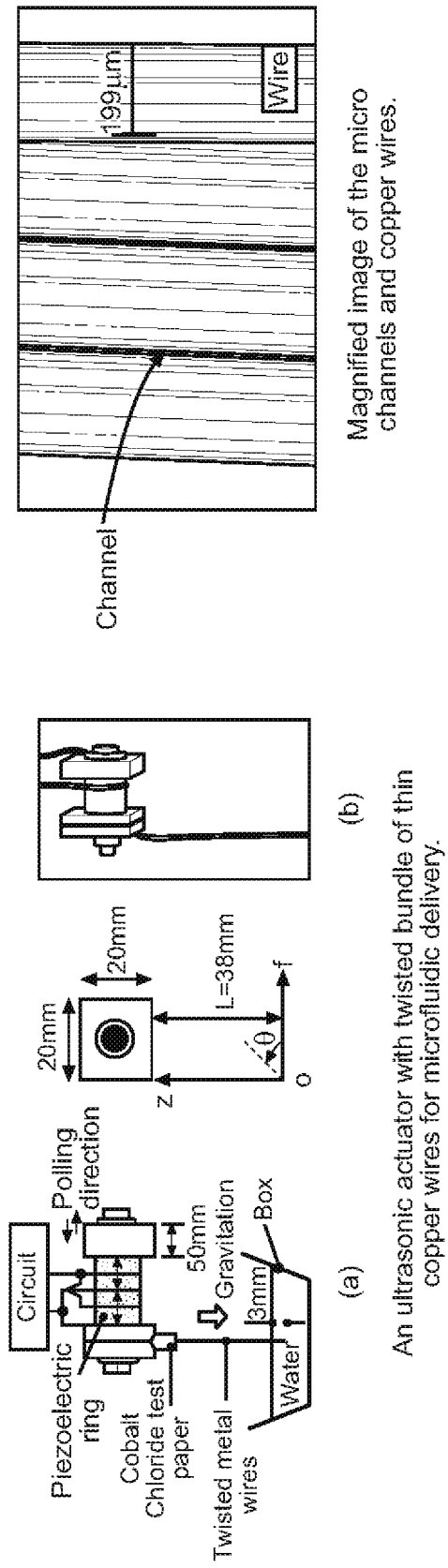
FIGS. 15 through 17 illustrate the effects of ultrasonic on capillary forces as discussed in the prior art.
Figure 16:
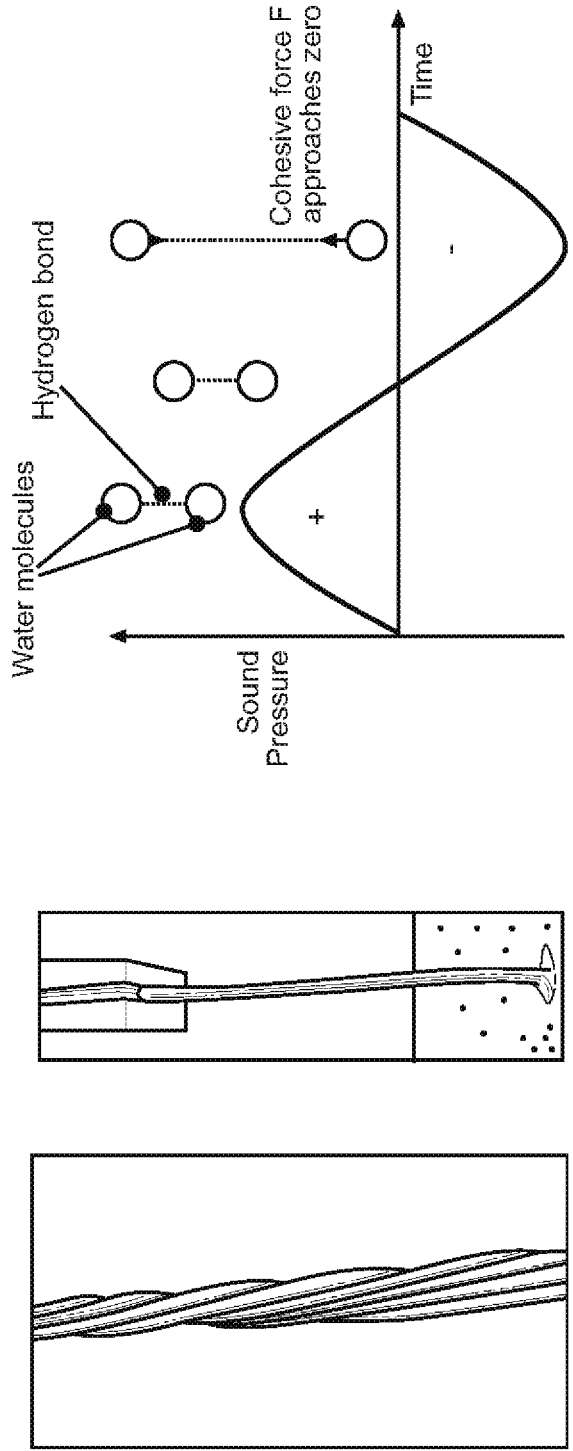
Figure 17:
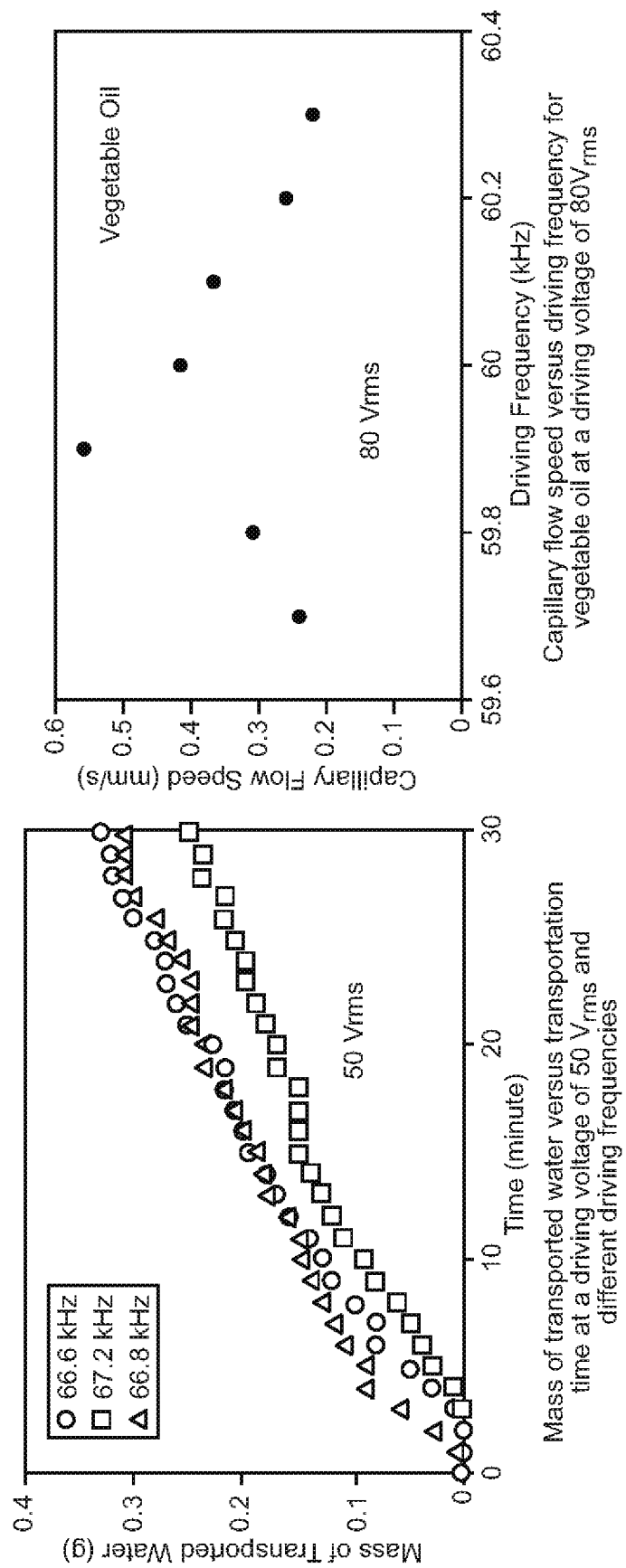

FIGS. 15 through 17 illustrate the effects of ultrasonic on capillary forces through data published in the prior art. The prior art is referenced here only to indicate that capillary force can be influenced through external means besides geometry.

Figure 18:
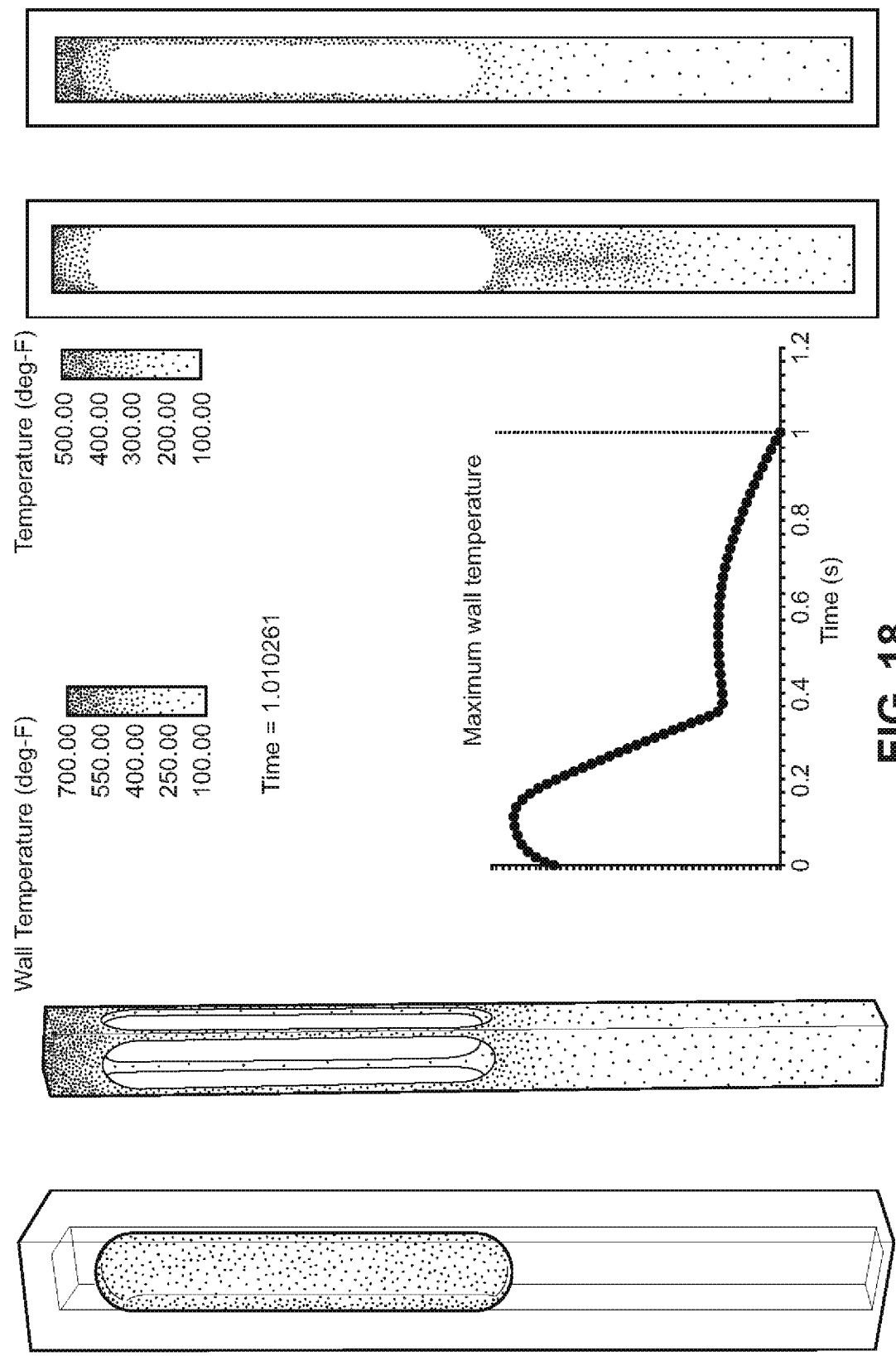
FIG. 18 illustrates the results of operation with an example embodiment as shown with a prior art simulation tool (e.g., Flow3D simulations)

FIG. 18 illustrates the results of the operation of an example embodiment as shown with a prior art simulation tool (e.g., Flow3D simulations). The Flow3D simulations show very promising thermal results and indicate how simulating this complex phenomenon can work with new and sophisticated tools. The simulation can be tuned and used to our advantage to yield sensitivity analysis.

Figure 19:
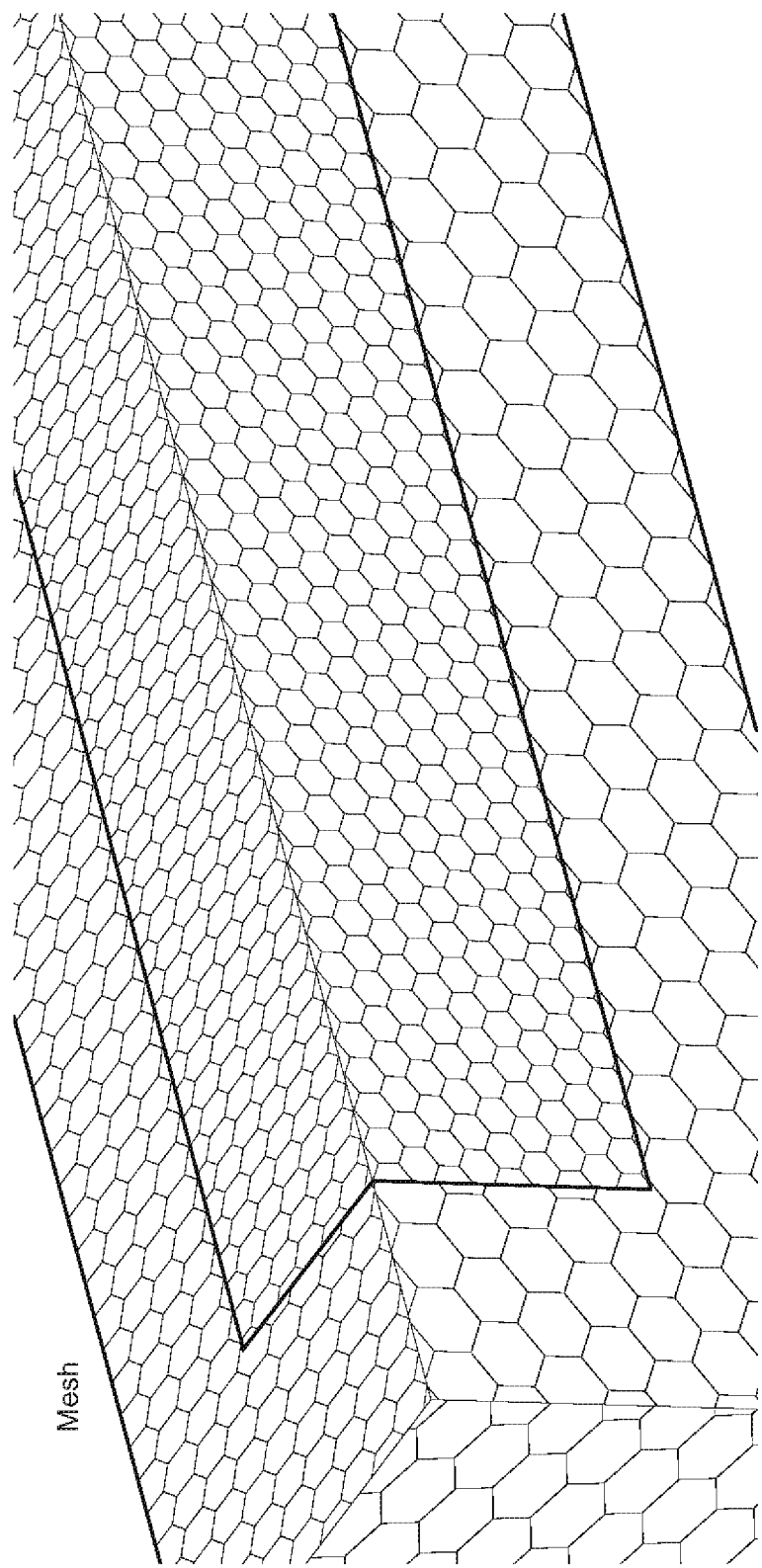
FIG. 19 illustrates an example embodiment of a three-dimensional shape embedded with a computational mesh of wickless capillary driven heat pipes, shown using a prior art simulation tool.

FIG. 19 illustrates an example embodiment of a three-dimensional shape embedded with a computational mesh of wickless capillary driven heat pipes, shown using a prior art simulation tool.

Figure 20:
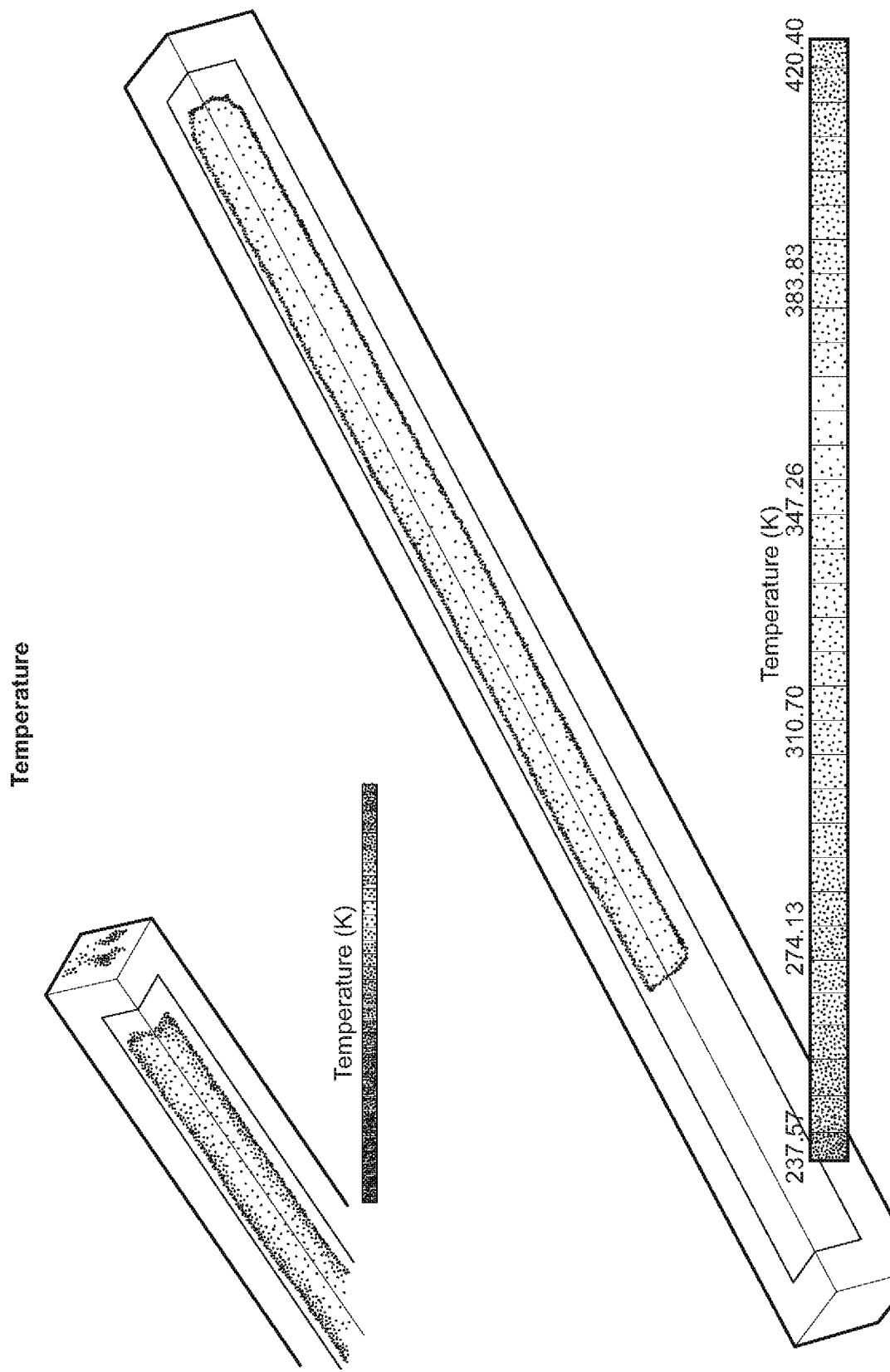
FIG. 20 illustrates an example of the temperature variations in a wickless capillary driven heat pipe of an example embodiment, shown using a prior art simulation tool.

FIG. 20 illustrates an example of the temperature variations in a wickless capillary driven heat pipe of an example embodiment, shown using a prior art simulation tool.

Figure 21:
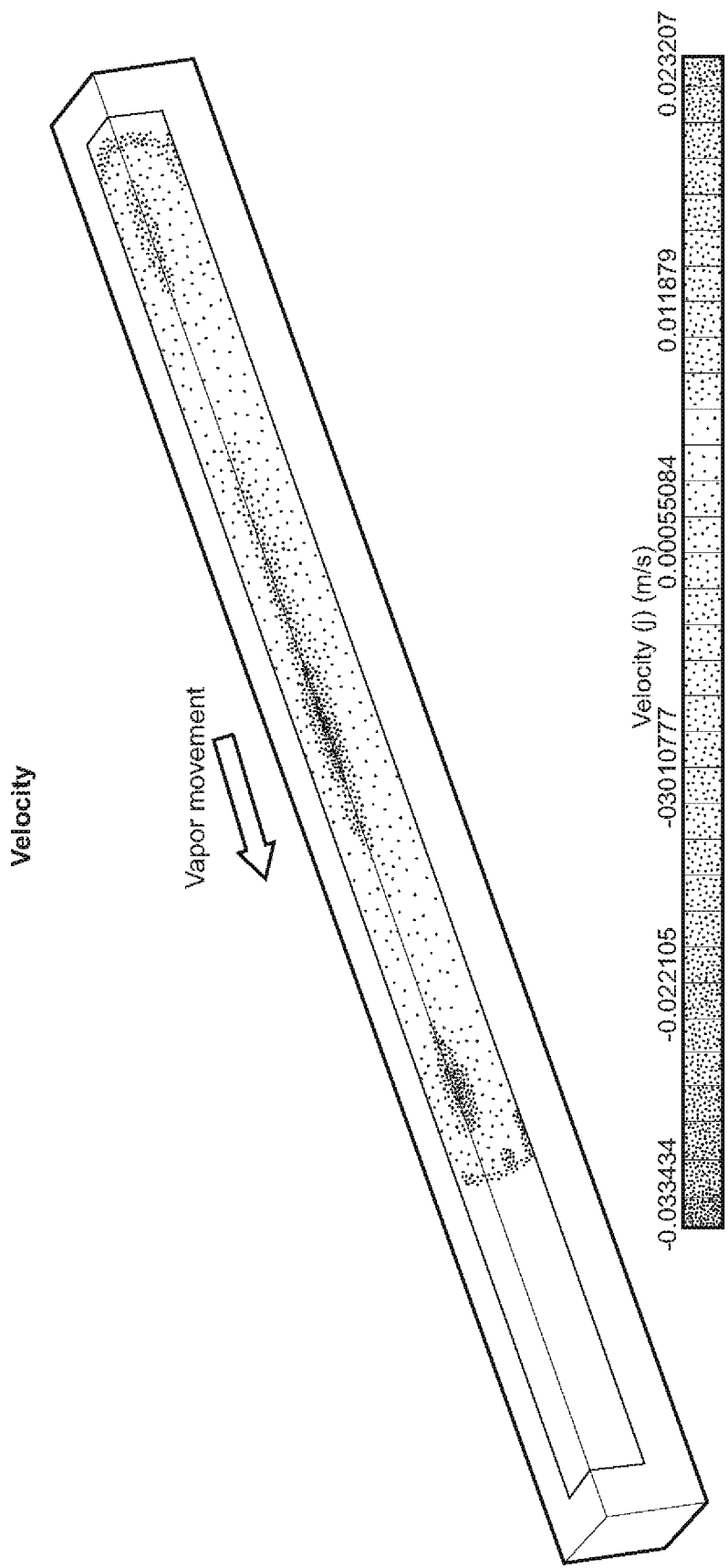
FIG. 21 illustrates an example of the vapor movement velocity variations in a wickless capillary driven heat pipe of an example embodiment, shown using a prior art simulation tool.

FIG. 21 illustrates an example of the vapor movement velocity variations in a wickless capillary driven heat pipe of an example embodiment, shown using a prior art simulation tool.

Figure 22:
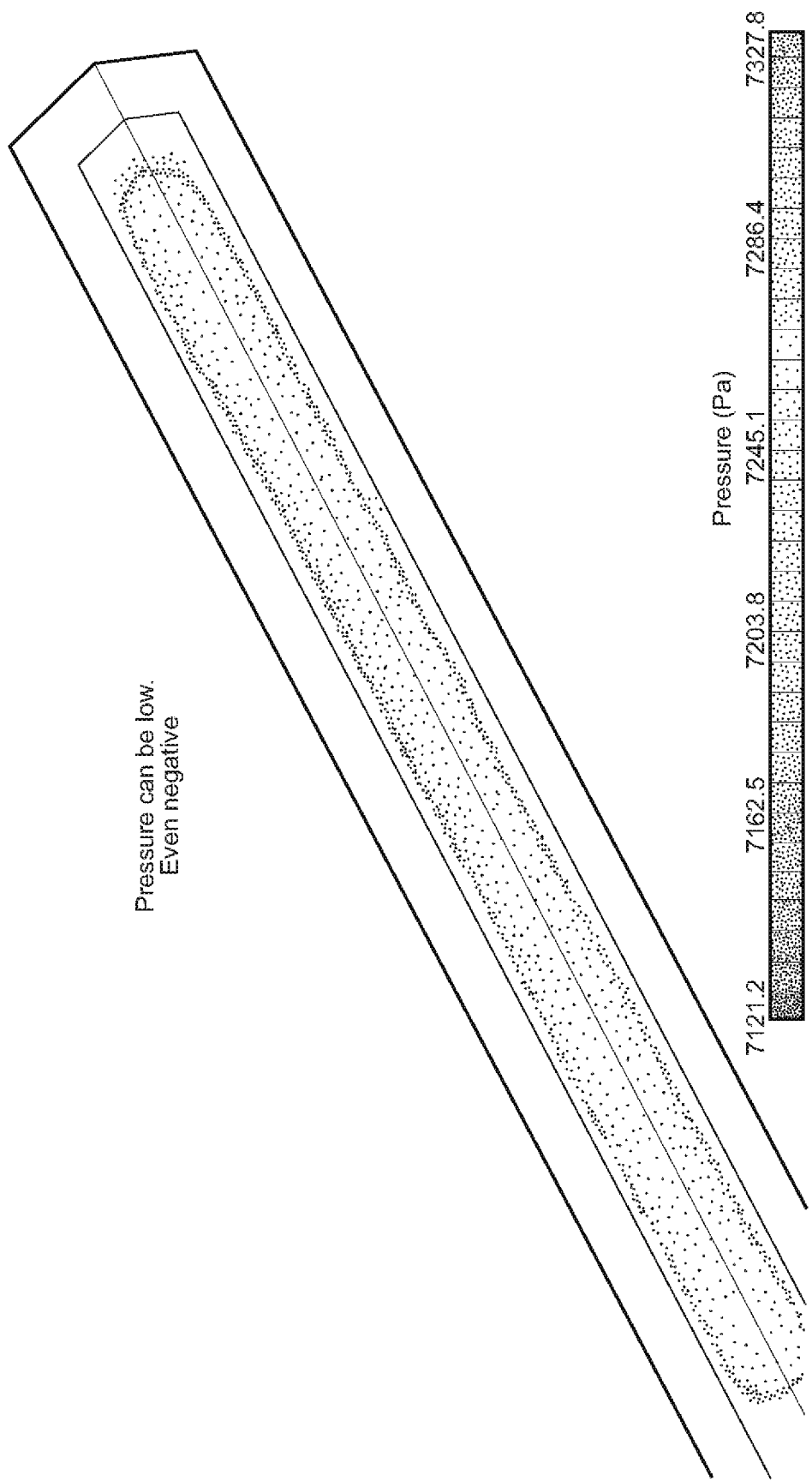
FIG. 22 illustrates an example of the pressure variations in a wickless capillary driven heat pipe of an example embodiment, shown using a prior art simulation tool.

FIG. 22 illustrates an example of the pressure variations in a wickless capillary driven heat pipe of an example embodiment, shown using a prior art simulation tool.

Figure 23:
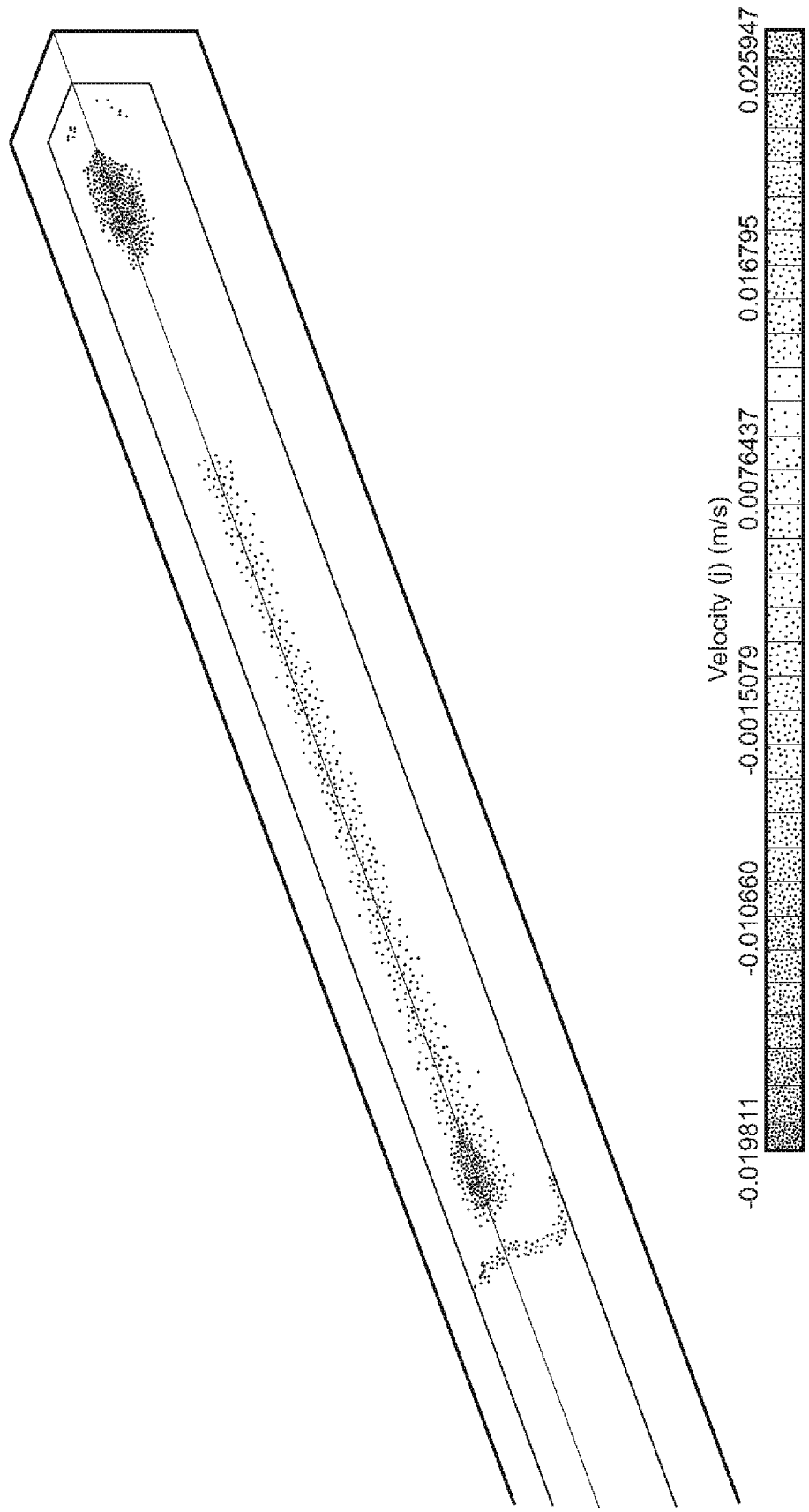
FIG. 23 illustrates an example of the velocity variations in a wickless capillary driven heat pipe of an example embodiment, shown using a prior art simulation tool.

FIG. 23 illustrates an example of the velocity variations in a wickless capillary driven heat pipe of an example embodiment, shown using a prior art simulation tool.

As described above, the wickless CVB heat pipes of the various embodiments can be formed in a variety of shapes and configurations and fabricated in a variety of ways to accommodate a variety of different applications. Some of these applications for various example embodiments are described in more detail below.

Application in Electronic Devices with Various System Platforms (e.g., Motherboards, Chassis, etc.)

Figure 24A:
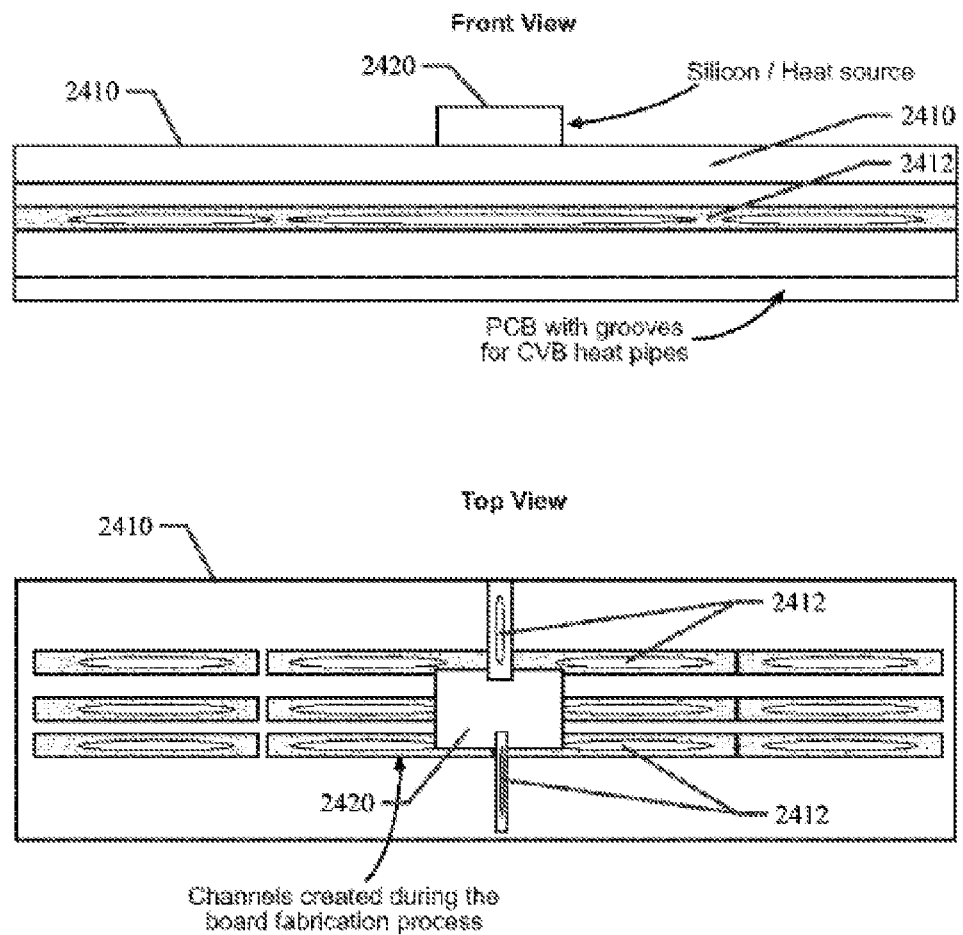
FIG. 24A illustrates an example embodiment of a layered motherboard with in-built channels for wickless capillary driven heat pipes.
Figure 24B:
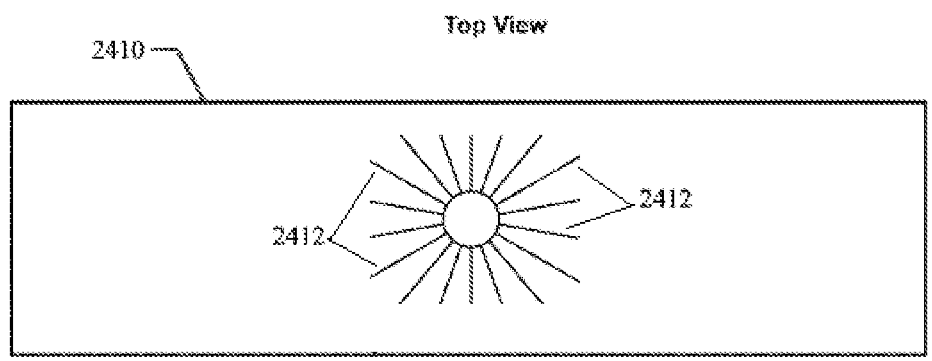
FIG. 24B illustrates an example layered motherboard with in-built channels for wickless capillary driven heat pipes in a second configuration.

FIG. 24a illustrates an example embodiment of a layered motherboard 2410 (e.g., a printed circuit board—PCB, an electronic circuit board, an analog or digital circuit board, a circuit board with embedded integrated circuit—IC devices, semiconductor or silicon devices, electronic devices, and the like) with in-built channels 2412 for insertion or integration of wickless capillary driven heat pipes. In an example embodiment, this technique can improve heat spreading characteristics of the board substrate. Typically, the layered motherboard 2410 includes electronic devices 2420 attached or embedded thereon. As well-known in the art, the layered motherboard 2410 can provide a system platform upon which an electronic system can be built from various electrical device components 2420, which can be attached and interconnected via the layered motherboard 2410. As is also well-known, the attached electronic devices 2420 can generate high levels of heat as the devices are used in normal operation. These levels of heat can serve as a limiting factor on the operation of the electronic system implemented on the motherboard 2410. To counteract this heat build-up on the motherboard 2410, the example embodiment provides in-built channels 2412 in the motherboard 2410, created in the circuit board fabrication process, to remove the heat from the center of the motherboard 2410 (or other locations on the motherboard 2410 where high levels of heat are present) and transfer the heat to the sides of the board by operation of wickless capillary driven heat pipes inserted, integrated, or otherwise embedded into the in-built channels 2412. The structure, fabrication, and operation of the embedded wickless capillary driven heat pipes is described in detail above. For example, FIGS. 9 through 12 described above detail various processes for the fabrication of embedded wickless capillary driven heat pipes in a substrate, such as a PCB, motherboard, chassis, or the like. In an example embodiment, the wickless capillary driven heat pipes can be embedded into a separate layer of the substrate. Because the wickless capillary driven heat pipes are embedded into the substrate of the motherboard 2410, the wickless capillary driven heat pipes can draw heat from the surrounding substrate and transfer the heat to other portions of the motherboard 2410 by operation of the fluid and air bubble within each wickless capillary driven heat pipe as described above. As shown in FIG. 24A, the orientation of the in-built channels 2412 and corresponding embedded wickless capillary driven heat pipes can be varied, depending on the thermal characteristics of the devices installed on the motherboard 2410. In some cases, as shown in FIG. 24A, it can be beneficial to orient the in-built channels 2412 and corresponding embedded wickless capillary driven heat pipes orthogonally to draw heat from the center of the motherboard 2410 to the edges. In other cases, as shown in FIG. 24B, it can be beneficial to orient the in-built channels 2412 and corresponding embedded wickless capillary driven heat pipes radially to draw heat from the center of the motherboard 2410 to the edges. In other cases, it can be beneficial to orient the in-built channels 2412 and corresponding embedded wickless capillary driven heat pipes in a serpentine pattern or other pattern to draw heat from the center of the motherboard 2410 to the edges or to areas of the motherboard 2410 configured to dissipate heat more efficiently. As such, the number of channels and embedded wickless capillary driven heat pipes, the routing of the channels, and geometries of the embedded wickless capillary driven heat pipes can be configured for a particular application and/or a particular motherboard 2410. The example embodiment shown in FIG. 24A can provide several benefits, including less temperature gradient and better cooling at the source. The cross patterns of the in-built channels 2412 and the corresponding embedded wickless capillary driven heat pipes can also help with changes to the orientation of the motherboard 2410. The embodiment shown in FIG. 24A can provide several advantages over the existing technologies including improved manufacturability over the current methods, better performance for a given form factor, smaller fan sizes, lower weight, and fewer complications.

Figure 25:
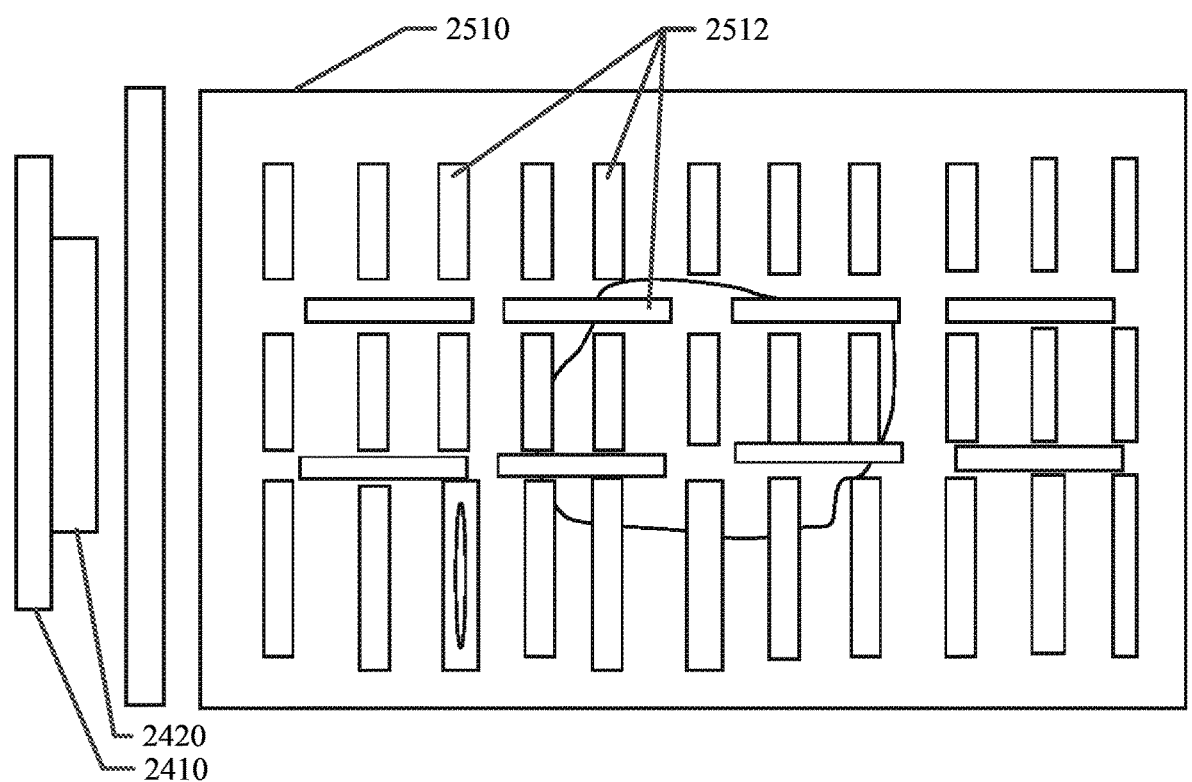
FIG. 25 illustrates an example embodiment of wickless heat pipes embedded in the chassis structure for better thermals and reduced weight.

FIG. 25 illustrates an example embodiment of wickless heat pipes embedded in the chassis structure for better thermals and reduced weight. In a manner similar to the channeling and embedding of wickless capillary driven heat pipes into a motherboard, the chassis, housing, enclosure, or other support structures 2510 of an electronic device can also be configured to include channeling and embedding of wickless capillary driven heat pipes 2512 into the support structure. Because the wickless capillary driven heat pipes 2512 are embedded into the substrate of the support structure 2510, the wickless capillary driven heat pipes 2512 can draw heat from the surrounding substrate and transfer the heat to other portions of the support structure 2510 by operation of the fluid and air bubble within each wickless capillary driven heat pipe 2512 as described above. As shown in FIG. 25, the orientation of the in-built wickless capillary driven heat pipes 2512 can be varied, depending on the thermal characteristics of the devices installed on or within the support structure 2510. In some cases, as shown in FIG. 25, it can be beneficial to orient the in-built wickless capillary driven heat pipes 2512 orthogonally to draw heat from the center of the support structure 2510 to the edges. In other cases, it can be beneficial to orient the in-built wickless capillary driven heat pipes 2512 radially to draw heat from the center of the support structure 2510 to the edges. In other cases, it can be beneficial to orient the in-built wickless capillary driven heat pipes 2512 in a serpentine pattern or other pattern to draw heat from the center of the support structure 2510 to the edges or to areas of the support structure 2510 configured to dissipate heat more efficiently. As such, the number of embedded wickless capillary driven heat pipes 2512, the routing of the embedded wickless capillary driven heat pipes 2512, and geometries of the embedded wickless capillary driven heat pipes 2512 can be configured for a particular application and/or a particular support structure 2510. The example embodiment shown in FIG. 25 illustrates cross patterning to allow for effectiveness in all orientations of a device. In an example embodiment, this technique can enhance heat spreading characteristics of the chassis skin or support structure surfaces. Micro channels can be fabricated into the support structure 2510 in a manner similar to the channels fabricated into the motherboard 2410 as described above. The wickless capillary driven heat pipes 2512 can be inserted, integrated, or otherwise embedded into components or portions of the support structure 2510 to spread or otherwise dissipate the heat generated by devices on or within the support structure 2510. The cross patterns of the wickless capillary driven heat pipes 2512 can help with changes to the orientation of the support structure 2510. The embodiment shown in FIG. 25 can provide several benefits, including smaller temperature gradients on the external skin of the support structure, increased thermal operating characteristics, and better cooling capabilities. The various embodiments described herein can provide several advantages over the existing technologies including reduced weight of the support structure, higher effective thermal conductivities, and reduced thickness of the components or portions of the support structure.

Referring now to FIG. 26, a processing flow diagram illustrates an example embodiment of a method 1100 as described herein. The method 1100 of an example embodiment includes: fabricating an electronic circuit into a substrate (processing block 1110); and fabricating a plurality of embedded wickless capillary driven constrained vapor bubble heat pipes into the substrate, each wickless capillary driven constrained vapor bubble heat pipe including a body having a capillary therein with generally square corners and a high energy interior surface, and a highly wettable liquid partially filling the capillary to dissipate heat between an evaporator region and a condenser region (processing block 1120).

Embodiments described herein are applicable for use with all types of semiconductor integrated circuit ("IC") chips. Examples of these IC chips include but are not limited to processors, controllers, chipset components, programmable logic arrays (PLAs), memory chips, network chips, systems on chip (SoCs), SSD/NAND controller ASICs, and the like. In addition, in some of the drawings, signal conductor lines are represented with lines. Any represented signal lines, whether or not having additional information, may actually comprise one or more signals that may travel in multiple directions and may be implemented with any suitable type of signal scheme, e.g., digital or analog lines implemented with differential pairs, optical fiber lines, and/or single-ended lines.

Example sizes/models/values/ranges may have been given, although embodiments are not limited to the same. As manufacturing techniques (e.g., photolithography) mature over time, it is expected that devices of smaller size can be manufactured. In addition, well-known power/ground connections to integrated circuit (IC) chips and other components may or may not be shown within the figures, for simplicity of illustration and discussion, and so as not to obscure certain aspects of the embodiments. Further, arrangements may be shown in block diagram form in order to avoid obscuring embodiments, and also in view of the fact that specifics with respect to implementation of such block diagram arrangements are highly dependent upon the system platform within which the embodiment is to be implemented, i.e., such specifics should be well within purview of one of ordinary skill in the art. Where specific details (e.g., circuits) are set forth in order to describe example embodiments, it should be apparent to one of ordinary skill in the art that embodiments can be practiced without, or with variation of, these specific details. The description is thus to be regarded as illustrative instead of limiting.

The term "coupled" may be used herein to refer to any type of relationship, direct or indirect, between the components in question, and may apply to electrical, mechanical, fluid, optical, electromagnetic, electromechanical or other connections. In addition, the terms "first", "second", etc. may be used herein only to facilitate discussion, and carry no particular temporal or chronological significance unless otherwise indicated.

Included herein is a set of process or logic flows representative of example methodologies for performing novel aspects of the disclosed architecture. While, for purposes of simplicity of explanation, the one or more methodologies shown herein are shown and described as a series of acts, those of ordinary skill in the art will understand and appreciate that the methodologies are not limited by the order of acts. Some acts may, in accordance therewith, occur in a different order and/or concurrently with other acts from those shown and described herein. For example, those of ordinary skill in the art will understand and appreciate that a methodology can alternatively be represented as a series of interrelated states or events, such as in a state diagram. Moreover, not all acts illustrated in a methodology may be required for a novel implementation. A logic flow may be implemented in software, firmware, and/or hardware. In software and firmware embodiments, a logic flow may be implemented by computer executable instructions stored on at least one non-transitory computer readable medium or machine readable medium, such as an optical, magnetic or semiconductor storage. The example embodiments disclosed herein are not limited in this respect.

The various elements of the example embodiments as previously described with reference to the figures may include or be used with various hardware elements, software elements, or a combination of both. Examples of hardware elements may include devices, logic devices, components, processors, microprocessors, circuits, processors, circuit elements (e.g., transistors, resistors, capacitors, inductors, and so forth), integrated circuits, application specific integrated circuits (ASIC), programmable logic devices (PLD), digital signal processors (DSP), field programmable gate array (FPGA), memory units, logic gates, registers, semiconductor device, chips, microchips, chip sets, and so forth. Examples of software elements may include software components, programs, applications, computer programs, application programs, system programs, software development programs, machine programs, operating system software, middleware, firmware, software modules, routines, subroutines, functions, methods, procedures, software interfaces, application program interfaces (API), instruction sets, computing code, computer code, code segments, computer code segments, words, values, symbols, or any combination thereof. However, determining whether an embodiment is implemented using hardware elements and/or software elements may vary in accordance with any number of factors, such as desired computational rate, power levels, heat tolerances, processing cycle budget, input data rates, output data rates, memory resources, data bus speeds and other design or performance constraints, as desired for a given implementation.

The example embodiments described herein provide a technical solution to a technical problem. The various embodiments improve the functioning of the electronic device and a related system by enabling the fabrication and use of systems and methods for providing and using a wickless capillary driven constrained vapor bubble heat pipe to dissipate heat. The various embodiments also serve to transform the state of various system components based on better thermal dissipation characteristics of the electronic devices and systems. Additionally, the various embodiments effect an improvement in a variety of technical fields including the fields of thermal management, electronic systems and device fabrication and use, circuit board fabrication, semiconductor device fabrication and use, computing and networking devices, and mobile communication devices.

Figure 27:
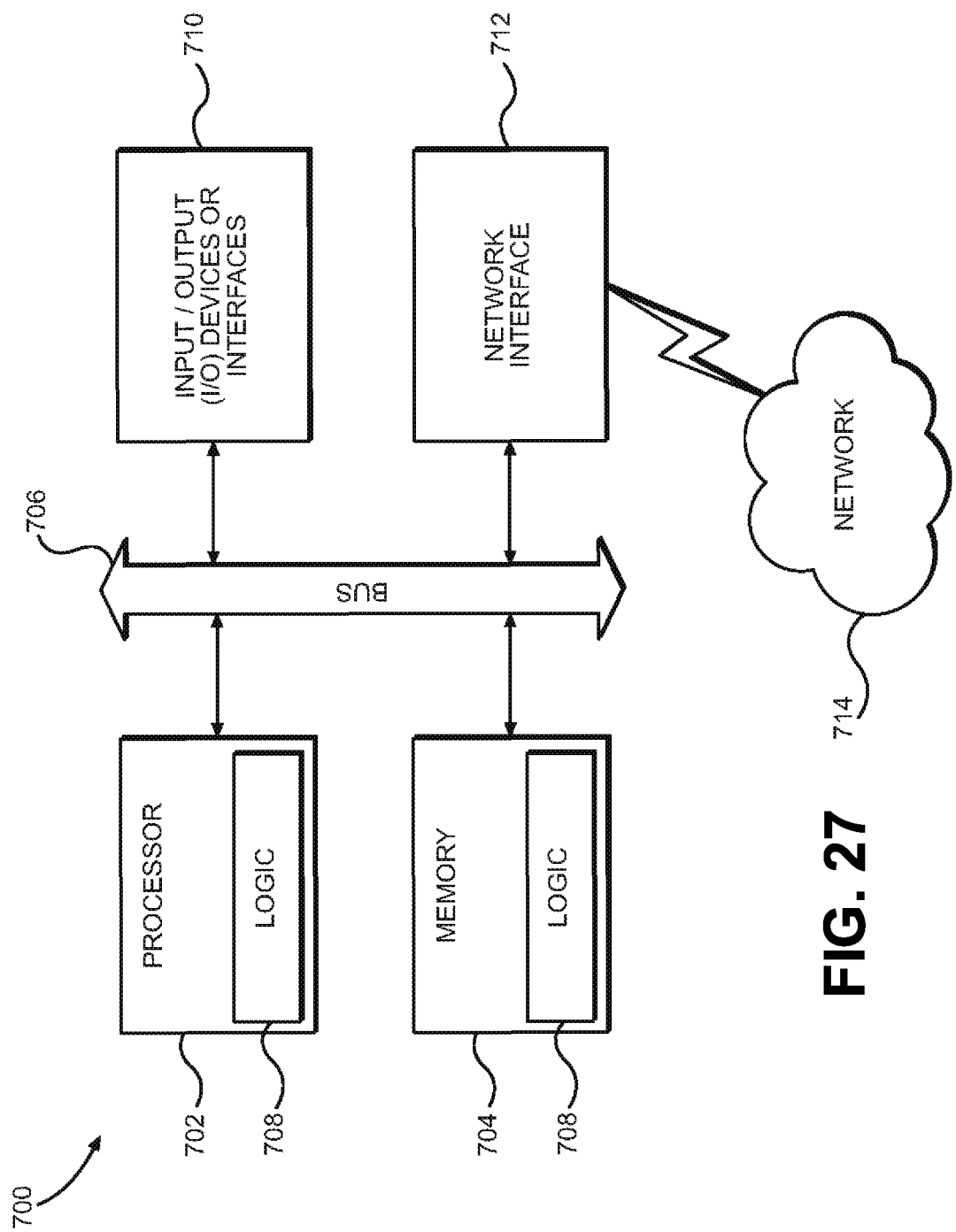
FIG. 27 shows a diagrammatic representation of a machine in the example form of a mobile computing and/or communication system within which a set of instructions when executed and/or processing logic when activated may cause the machine to perform any one or more of the methodologies described and/or claimed herein.

FIG. 27 illustrates a diagrammatic representation of a machine in the example form of an electronic device, such as a mobile computing and/or communication system 700 within which a set of instructions when executed and/or processing logic when activated may cause the machine to perform any one or more of the methodologies described and/or claimed herein. In alternative embodiments, the machine operates as a standalone device or may be connected (e.g., networked) to other machines. In a networked deployment, the machine may operate in the capacity of a server or a client machine in server-client network environment, or as a peer machine in a peer-to-peer (or distributed) network environment. The machine may be a personal computer (PC), a laptop computer, a tablet computing system, a Personal Digital Assistant (PDA), a cellular telephone, a smartphone, a web appliance, a set-top box (STB), a network router, switch or bridge, or any machine capable of executing a set of instructions (sequential or otherwise) or activating processing logic that specify actions to be taken by that machine. Further, while only a single machine is illustrated, the term "machine" can also be taken to include any collection of machines that individually or jointly execute a set (or multiple sets) of instructions or processing logic to perform any one or more of the methodologies described and/or claimed herein.

The example mobile computing and/or communication system 700 includes a data processor 702 (e.g., a System-on-a-Chip [SoC], general processing core, graphics core, and optionally other processing logic) and a memory 704, which can communicate with each other via a bus or other data transfer system 706. The mobile computing and/or communication system 700 may further include various input/output (I/O) devices and/or interfaces 710, such as a touchscreen display and optionally a network interface 712. In an example embodiment, the network interface 712 can include one or more radio transceivers configured for compatibility with any one or more standard wireless and/or cellular protocols or access technologies (e.g., 2nd (2G), 2.5, 3rd (3G), 4th (4G) generation, and future generation radio access for cellular systems, Global System for Mobile communication (GSM), General Packet Radio Services (GPRS), Enhanced Data GSM Environment (EDGE), Wideband Code Division Multiple Access (WCDMA), LTE, CDMA2000, WLAN, Wireless Router (WR) mesh, and the like). Network interface 712 may also be configured for use with various other wired and/or wireless communication protocols, including TCP/IP, UDP, SIP, SMS, RTP, WAP, CDMA, TDMA, UMTS, UWB, WiFi, WiMax, Bluetooth™, IEEE 802.11x, and the like. In essence, network interface 712 may include or support virtually any wired and/or wireless communication mechanisms by which information may travel between the mobile computing and/or communication system 700 and another computing or communication system via network 714.

The memory 704 can represent a machine-readable medium on which is stored one or more sets of instructions, software, firmware, or other processing logic (e.g., logic 708) embodying any one or more of the methodologies or functions described and/or claimed herein. The logic 708, or a portion thereof, may also reside, completely or at least partially within the processor 702 during execution thereof by the mobile computing and/or communication system 700. As such, the memory 704 and the processor 702 may also constitute machine-readable media. The logic 708, or a portion thereof, may also be configured as processing logic or logic, at least a portion of which is partially implemented in hardware. The logic 708, or a portion thereof, may further be transmitted or received over a network 714 via the network interface 712. While the machine-readable medium of an example embodiment can be a single medium, the term "machine-readable medium" should be taken to include a single non-transitory medium or multiple non-transitory media (e.g., a centralized or distributed database, and/or associated caches and computing systems) that store the one or more sets of instructions. The term "machine-readable medium" can also be taken to include any non-transitory medium that is capable of storing, encoding or carrying a set of instructions for execution by the machine and that cause the machine to perform any one or more of the methodologies of the various embodiments, or that is capable of storing, encoding or carrying data structures utilized by or associated with such a set of instructions. The term "machine-readable medium" can accordingly be taken to include, but not be limited to, solid-state memories, optical media, and magnetic media.

With general reference to notations and nomenclature used herein, the description presented herein may be disclosed in terms of program procedures executed on a computer or a network of computers. These procedural descriptions and representations may be used by those of ordinary skill in the art to convey their work to others of ordinary skill in the art.

A procedure is generally conceived to be a self-consistent sequence of operations performed on electrical, magnetic, or optical signals capable of being stored, transferred, combined, compared, and otherwise manipulated. These signals may be referred to as bits, values, elements, symbols, characters, terms, numbers, or the like. It should be noted, however, that all of these and similar terms are to be associated with the appropriate physical quantities and are merely convenient labels applied to those quantities. Further, the manipulations performed are often referred to in terms such as adding or comparing, which operations may be executed by one or more machines. Useful machines for performing operations of various embodiments may include general-purpose digital computers or similar devices. Various embodiments also relate to apparatus or systems for performing these operations. This apparatus may be specially constructed for a purpose, or it may include a general-purpose computer as selectively activated or reconfigured by a computer program stored in the computer. The procedures presented herein are not inherently related to a particular computer or other apparatus. Various general-purpose machines may be used with programs written in accordance with teachings herein, or it may prove convenient to construct more specialized apparatus to perform methods described herein.

Various example embodiments using these new techniques are described in more detail herein. In various embodiments as described herein, example embodiments include at least the following examples.

An apparatus comprising: a substrate; and a plurality of wickless capillary driven constrained vapor bubble heat pipes embedded in the substrate, each wickless capillary driven constrained vapor bubble heat pipe including a body having a capillary therein with generally square corners and a high energy interior surface, and a highly wettable liquid partially filling the capillary to dissipate heat between an evaporator region and a condenser region.

The apparatus as described above wherein the substrate is of a type from the group consisting of: a printed circuit board (PCB), an electronic circuit board, a motherboard, a circuit board with embedded integrated circuit (IC) devices, a circuit board with embedded semiconductor or silicon devices, a chassis, a housing, an enclosure, and a support structure of an electronic device.

The apparatus as described above wherein the plurality of wickless capillary driven constrained vapor bubble heat pipes are embedded in the substrate in a generally orthogonal orientation.

The apparatus as described above wherein the plurality of wickless capillary driven constrained vapor bubble heat pipes are embedded in the substrate in a generally radial orientation.

The apparatus as described above wherein the plurality of wickless capillary driven constrained vapor bubble heat pipes are embedded in the substrate in a generally cross-pattern orientation.

The apparatus as described above wherein the plurality of wickless capillary driven constrained vapor bubble heat pipes are embedded in the substrate in a separate layer of the substrate.

The apparatus as described above wherein the plurality of wickless capillary driven constrained vapor bubble heat pipes are embedded in the substrate using a chemical etching process.

The apparatus as described above wherein the plurality of wickless capillary driven constrained vapor bubble heat pipes are embedded in the substrate using a mechanical subtraction process.

The apparatus as described above wherein the plurality of wickless capillary driven constrained vapor bubble heat pipes are filled with the wettable liquid which is sealed into the capillary.

A system comprising: an electronic device embedded on a substrate; and a plurality of wickless capillary driven constrained vapor bubble heat pipes embedded in the substrate, each wickless capillary driven constrained vapor bubble heat pipe including a body having a capillary therein with generally square corners and a high energy interior surface, and a highly wettable liquid partially filling the capillary to dissipate heat between an evaporator region and a condenser region.

The system as described above wherein the substrate is of a type from the group consisting of: a printed circuit board (PCB), an electronic circuit board, a motherboard, a circuit board with embedded integrated circuit (IC) devices, a circuit board with embedded semiconductor or silicon devices, a chassis, a housing, an enclosure, and a support structure of an electronic device.

The system as described above wherein the plurality of wickless capillary driven constrained vapor bubble heat pipes are embedded in the substrate in a generally orthogonal orientation.

The system as described above wherein the plurality of wickless capillary driven constrained vapor bubble heat pipes are embedded in the substrate in a generally radial orientation.

The system as described above wherein the plurality of wickless capillary driven constrained vapor bubble heat pipes are embedded in the substrate in a generally cross-pattern orientation.

The system as described above wherein the plurality of wickless capillary driven constrained vapor bubble heat pipes are embedded in the substrate in a separate layer of the substrate.

The system as described above wherein the plurality of wickless capillary driven constrained vapor bubble heat pipes are embedded in the substrate using a chemical etching process.

The system as described above wherein the plurality of wickless capillary driven constrained vapor bubble heat pipes are embedded in the substrate using a mechanical subtraction process.

The system as described above wherein the plurality of wickless capillary driven constrained vapor bubble heat pipes are filled with the wettable liquid which is sealed into the capillary.

A method comprising: fabricating an electronic circuit into a substrate; and fabricating a plurality of embedded wickless capillary driven constrained vapor bubble heat pipes into the substrate, each wickless capillary driven constrained vapor bubble heat pipe including a body having a capillary therein with generally square corners and a high energy interior surface, and a highly wettable liquid partially filling the capillary to dissipate heat between an evaporator region and a condenser region.

The method as described above wherein the substrate is of a type from the group consisting of: a printed circuit board (PCB), an electronic circuit board, a motherboard, a circuit board with embedded integrated circuit (IC) devices, a circuit board with embedded semiconductor or silicon devices, a chassis, a housing, an enclosure, and a support structure of an electronic device.

The method as described above wherein the plurality of wickless capillary driven constrained vapor bubble heat pipes are embedded in the substrate in a generally orthogonal orientation.

The method as described above wherein the plurality of wickless capillary driven constrained vapor bubble heat pipes are embedded in the substrate in a generally radial orientation.

The method as described above wherein the plurality of wickless capillary driven constrained vapor bubble heat pipes are embedded in the substrate in a generally cross-pattern orientation.

The method as described above wherein the plurality of wickless capillary driven constrained vapor bubble heat pipes are embedded in the substrate in a separate layer of the substrate.

The method as described above wherein the plurality of wickless capillary driven constrained vapor bubble heat pipes are embedded in the substrate using a chemical etching process.

The method as described above wherein the plurality of wickless capillary driven constrained vapor bubble heat pipes are embedded in the substrate using a mechanical subtraction process.

The method as described above including filling the capillary with the wettable liquid and sealing the wettable liquid into the capillary.

An apparatus comprising: a substrate; and a plurality of wickless heat dissipation means embedded in the substrate, each wickless heat dissipation means including a body having an in-built channel means therein with generally square corners and a high energy interior surface, and a fluid means partially filling the in-built channel means to dissipate heat between an evaporator region and a condenser region.

The apparatus as described above wherein the substrate is of a type from the group consisting of: a printed circuit board (PCB), an electronic circuit board, a motherboard, a circuit board with embedded integrated circuit (IC) devices, a circuit board with embedded semiconductor or silicon devices, a chassis, a housing, an enclosure, and a support structure of an electronic device.

The apparatus as described above wherein the plurality of wickless heat dissipation means are embedded in the substrate in a generally orthogonal orientation.

The apparatus as described above wherein the plurality of wickless heat dissipation means are embedded in the substrate in a generally radial orientation.

The apparatus as described above wherein the plurality of wickless heat dissipation means are embedded in the substrate in a generally cross-pattern orientation.

The apparatus as described above wherein the plurality of wickless heat dissipation means are embedded in the substrate in a separate layer of the substrate.

The apparatus as described above wherein the plurality of wickless heat dissipation means are embedded in the substrate using a chemical etching process.

The apparatus as described above wherein the plurality of wickless heat dissipation means are embedded in the substrate using a mechanical subtraction process.

The apparatus as described above wherein the plurality of wickless heat dissipation means are filled with the wettable liquid which is sealed into the capillary.

The Abstract of the Disclosure is provided to allow the reader to quickly ascertain the nature of the technical disclosure. It is submitted with the understanding that it will not be used to interpret or limit the scope or meaning of the claims. In addition, in the foregoing Detailed Description, it can be seen that various features are grouped together in a single embodiment for the purpose of streamlining the disclosure. This method of disclosure is not to be interpreted as reflecting an intention that the claimed embodiments require more features than are expressly recited in each claim. Rather, as the following claims reflect, inventive subject matter lies in less than all features of a single disclosed embodiment. Thus, the following claims are hereby incorporated into the Detailed Description, with each claim standing on its own as a separate embodiment.

What is claimed is:

1. An apparatus comprising:
   a substrate including:
     a first channel;
     a second channel, the first channel substantially parallel to the second channel; and
     a third channel, the third channel substantially orthogonal to the second channel;
   a first wickless capillary driven constrained vapor bubble heat pipe embedded in the first channel, the first wickless capillary driven constrained vapor bubble heat pipe including a first capillary, the first capillary including:
     a first curved wall;
     a first linear wall directly coupled to the first curved wall;
     a second curved wall;
     a second linear wall directly coupled to the second curved wall and the second linear wall directly coupled to the first linear wall;
     a first substantially square corner formed by the first linear wall and the second linear wall;
     a third linear wall directly coupled to the second curved wall;

a third curved wall;
a fourth linear wall directly coupled to the third curved wall and the fourth linear wall directly coupled to the third linear wall; and
a second substantially square corner formed by the third linear wall and the fourth linear wall; and
a first amount of a liquid partially filling the first capillary to dissipate heat;
a second wickless capillary driven constrained vapor bubble heat pipe embedded in the second channel, the second wickless capillary driven constrained vapor bubble heat pipe including a second capillary with substantially square corners and a second amount of the liquid partially filling the second capillary to dissipate the heat; and
a third wickless capillary driven constrained vapor bubble heat pipe embedded in the third channel, the third wickless capillary driven constrained vapor bubble heat pipe including a third capillary with substantially square corners and a third amount of the liquid partially filling the third capillary to dissipate the heat.

2. The apparatus of claim 1, wherein the substrate includes at least one of a printed circuit board (PCB), an electronic circuit board, a motherboard, a circuit board with embedded integrated circuit (IC) devices, a circuit board with embedded semiconductor or silicon devices, a chassis, a housing, an enclosure, or a support structure of an electronic device.

3. The apparatus of claim 1, wherein the first wickless capillary driven constrained vapor bubble heat pipe and the second wickless capillary driven constrained vapor bubble heat pipe are embedded in the substrate in a substantially cross-pattern orientation.

4. An apparatus comprising:
a substrate;
a first means for dissipating heat, the first means embedded in the substrate; and
a second means for dissipating the heat, the second means embedded in the substrate substantially orthogonal to the first means, respective ones of the first and second means including an in-built channel,
the in-built channel including:
a first curved wall;
a first linear wall directly coupled to the first curved wall;
a second curved wall;
a second linear wall directly coupled to the second curved wall and the second linear wall directly coupled to the first linear wall;
a first substantially square corner formed by the first linear wall and the second linear wall;
a third linear wall directly coupled to the second curved wall;
a third curved wall;
a fourth linear wall directly coupled to the third curved wall and the fourth linear wall directly coupled to the third linear wall;
a second substantially square corner formed by the third linear wall and the fourth linear wall; and
a fluid partially filling the in-built channel to dissipate the heat between an evaporator region and a condenser region of the in-built channel.

5. The apparatus of claim 4, wherein the substrate includes at least one of a printed circuit board (PCB), an electronic circuit board, a motherboard, a circuit board with embedded integrated circuit (IC) devices, a circuit board with embedded semiconductor or silicon devices, a chassis, a housing, an enclosure, or a support structure of an electronic device.

6. The apparatus of claim 4, wherein the substrate has a first axis and a second axis orthogonal to the first axis, the first and second means embedded in the substrate in a substantially orthogonal orientation relative to one of the first axis or the second axis.

7. The apparatus of claim 4, wherein the first and second means are embedded in the substrate in a substantially radial orientation.

8. The apparatus of claim 4, wherein at least one of the first and second heat means are embedded in the substrate in a substantially cross-pattern orientation.

9. A method comprising:
fabricating an electronic circuit into a substrate, the substrate including a first axis and a second axis, the second axis orthogonal to the first axis;
forming a first channel in the substrate substantially orthogonally to the second axis;
forming a second channel in the substrate substantially orthogonally to the second axis;
forming a third channel in the substrate substantially orthogonally to the first axis;
fabricating a first wickless capillary driven constrained vapor bubble heat pipe into the first channel, the first wickless capillary driven constrained vapor bubble heat pipe including a first capillary, the first capillary including:
a first curved wall;
a first linear wall directly coupled to the first curved wall;
a second curved wall;
a second linear wall directly coupled to the second curved wall and the second linear wall directly coupled to the first linear wall;
a first substantially square corner formed by the first linear wall and the second linear wall;
a third linear wall directly coupled to the second curved wall;
a third curved wall;
a fourth linear wall directly coupled to the third curved wall and the fourth linear wall directly coupled to the third linear wall; and
a second substantially square corner formed by the third linear wall and the fourth linear wall, the first capillary to include a first amount of a liquid to partially fill the first capillary to dissipate heat;
fabricating a second wickless capillary driven constrained vapor bubble heat pipe into the second channel, the second wickless capillary driven constrained vapor bubble heat pipe including a second capillary with substantially square corners, the second capillary to include a second amount of the liquid to partially fill the second capillary to dissipate the heat; and
fabricating a third wickless capillary driven constrained vapor bubble heat pipe into the third channel, the third wickless capillary driven constrained vapor bubble heat pipe including a third capillary therein with substantially square corners, the third capillary to include a third amount of the liquid to partially fill the third capillary to dissipate the heat.

10. The method of claim 9, wherein the substrate includes at least one of a printed circuit board (PCB), an electronic circuit board, a motherboard, a circuit board with embedded integrated circuit (IC) devices, a circuit board with embedded semiconductor or silicon devices, a chassis, a housing, an enclosure, or a support structure of an electronic device.

11. The method of claim 9, wherein the first, second, and third wickless capillary driven constrained vapor bubble heat pipes are embedded in the substrate using a chemical etching process.

12. The method of claim 9, wherein the first, second, and third wickless capillary driven constrained vapor bubble heat pipes are embedded in the substrate using a mechanical subtraction process.

13. The method of claim 9, further including:
filling the first capillary with the first amount of the liquid;
filling the second capillary with the second amount of the liquid;
filling the third capillary with the third amount of the liquid; and
sealing the first, second, and third capillaries.

14. A system comprising:
an electronic device embedded in a substrate; and
a wickless capillary driven constrained vapor bubble heat pipe embedded in the substrate, the wickless capillary driven constrained vapor bubble heat pipe including:
a capillary including:
a first curved wall,
a first linear wall directly coupled to the first curved wall,
a second curved wall,
a second linear wall directly coupled to the second curved wall,
a first corner formed by two first intersecting walls, a first of the two first intersecting walls of the first corner connected to the first linear wall and a second of the two first intersecting walls of the first corner connected to the second linear wall,
a third linear wall directly coupled to the second curved wall,
a third curved wall,
a fourth linear wall directly coupled to the third curved wall, and
a second corner formed by two second intersecting walls, a first of the two second intersecting walls of the second corner connected to the third linear wall and a second of the two second intersecting walls of the second corner connected to the fourth linear wall; and
a liquid partially filling the capillary to dissipate heat.

15. The system of claim 14, wherein the wickless capillary driven constrained vapor bubble heat pipe is a first wickless capillary driven constrained vapor bubble heat pipe, the system further including a second wickless capillary driven constrained vapor bubble heat pipe, the first wickless capillary driven constrained vapor bubble heat pipe and the second wickless capillary driven constrained vapor bubble heat pipe are embedded in the substrate in a substantially radial orientation.

16. The system of claim 14, wherein the wickless capillary driven constrained vapor bubble heat pipe is a first wickless capillary driven constrained vapor bubble heat pipe, the system further including a second wickless capillary driven constrained vapor bubble heat pipe.

17. The system of claim 14, wherein the substrate includes at least one of a printed circuit board (PCB), an electronic circuit board, a motherboard, a circuit board with embedded integrated circuit (IC) devices, a circuit board with embedded semiconductor or silicon devices, a chassis, a housing, an enclosure, or a support structure of the electronic device.

18. The system of claim 14, wherein the wickless capillary driven constrained vapor bubble heat pipe is a first wickless capillary driven constrained vapor bubble heat pipe, the system further including a second wickless capillary driven constrained vapor bubble heat pipe, the first wickless capillary driven constrained vapor bubble heat pipe and the second wickless capillary driven constrained vapor bubble heat pipe are embedded in the substrate in a substantially orthogonal orientation relative to each other.

19. The system of claim 14, wherein the corner is positioned inward of a first tangent to the first curved wall and a second tangent to the second curved wall, the first tangent orthogonal to the second tangent.

20. The system of claim 14, wherein the capillary includes:
a fifth linear wall directly coupled to the third curved wall;
a fourth curved wall;
a sixth linear wall directly coupled to the fourth curved wall;
a third corner formed by two third intersecting walls, a first of the two third intersecting walls of the third corner connected to the fifth linear wall and a second of the two third intersecting walls of the third corner connected to the sixth linear wall;
a seventh linear wall directly coupled to the fourth curved wall;
an eighth linear wall directly coupled to the first curved wall; and
a fourth corner formed by two fourth intersecting walls, a first of the two fourth intersecting walls of the fourth corner connected to the seventh linear wall and a second of the two fourth intersecting walls of the fourth corner connected to the eighth linear wall.

* * * * *